United States Patent
Laurent et al.

(10) Patent No.: US 11,754,636 B2
(45) Date of Patent: Sep. 12, 2023

(54) ESTIMATING THE SOH AND ESTIMATING THE SOC OF AN ELECTROCHEMICAL ELEMENT

(71) Applicant: SAFT, Levallois-Perret (FR)

(72) Inventors: Sébastien Laurent, Mérignac (FR); Gérard Barrailh, Monein (FR); Nathalie Legrand, Bruges (FR); Emilie Buisson, Poitiers (FR); Rémi Didelon, Payre (FR)

(73) Assignee: SAFT, Levallois-Perret (FR)

( * ) Notice: Subject to any disclaimer, the term of this patent is extended or adjusted under 35 U.S.C. 154(b) by 58 days.

(21) Appl. No.: 17/415,118

(22) PCT Filed: Dec. 15, 2019

(86) PCT No.: PCT/FR2019/053072
§ 371 (c)(1),
(2) Date: Feb. 14, 2022

(87) PCT Pub. No.: WO2020/128263
PCT Pub. Date: Jun. 25, 2020

(65) Prior Publication Data
US 2022/0187385 A1    Jun. 16, 2022

(30) Foreign Application Priority Data
Dec. 17, 2018 (FR) ..................... 1873112

(51) Int. Cl.
*G01R 31/392* (2019.01)
*G01R 31/382* (2019.01)
*G01R 31/36* (2020.01)

(52) U.S. Cl.
CPC ....... *G01R 31/392* (2019.01); *G01R 31/3648* (2013.01); *G01R 31/382* (2019.01)

(58) Field of Classification Search
CPC .................................................. G01R 31/382
(Continued)

(56) References Cited

U.S. PATENT DOCUMENTS

2010/0090650 A1* 4/2010 Yazami ............... H01M 10/486
324/426
2017/0324122 A1   11/2017 Poirier et al.
(Continued)

FOREIGN PATENT DOCUMENTS

DE   10 2012 208 509 A1   11/2013
DE   10 2012 209 271 A1   12/2013
(Continued)

OTHER PUBLICATIONS

Written Opinion of the International Searching Authority, PCT/FR/2019/053072, 7 pages, dated Dec. 17, 2018.

*Primary Examiner* — Ricky Go
(74) *Attorney, Agent, or Firm* — Sunstein LLP

(57) ABSTRACT

The invention concerns a method for estimating the state of health (SOH) of an electrochemical element, comprising: initiating a charging or discharging operation of the electrochemical element; measuring values representing deformations of the electrochemical element while the charging or discharging operation is being performed, the deformation values measured forming a deformations image signal according to the quantity of electricity passing through the electrochemical element over time; comparing the deformations image signal and a reference image signal, one or more differences obtained by the comparison characterising an estimation of the ageing of the electrochemical element.

12 Claims, 17 Drawing Sheets

(58) Field of Classification Search
USPC .......................................................... 702/63
See application file for complete search history.

(56) References Cited

U.S. PATENT DOCUMENTS

2019/0195956 A1* 6/2019 Lim .................... G01R 31/392
2021/0197691 A1* 7/2021 Stefanopoulou .... H01M 10/425

FOREIGN PATENT DOCUMENTS

| FR | 2991 510 A1 | 12/2013 |
| WO | WO 2011/072295 A2 | 6/2011 |
| WO | WO 2011/072295 A3 | 6/2011 |
| WO | WO 2017/087807 A1 | 5/2017 |

* cited by examiner

|  | Cell deformation (C rate) | | | | |
| --- | --- | --- | --- | --- | --- |
|  | PeakMin (Ah) | PeakMax (Ah) | SEI Growth | CapaNeg Loss | Capa Loss |
| Initial State | 9 | 19,3 | - | - | - |
| After 1st ageing | 4,4 | 12 | 4,6 | 2,7 | 7,3 |
| After 2nd ageing | 4,5 | 12,7 | -0,1 | -0,6 | -0,7 |
| After 3rd ageing | 2,9 | 11,6 | 1,6 | -0,5 | 1,1 |

FIG. 9

|  | Cell deformation (C rate) | | | | |
| --- | --- | --- | --- | --- | --- |
|  | $AhDch_{PeakMin}$ (Ah) | $AhDch_{PeakMax}$ (Ah) | $Capa_{Batt}$ (Ah) | $SOC_{PeakMin}$ (%) | $SOC_{PeakMax}$ (%) |
| Initial State | 9 | 19,3 | 31,51 | 71,4 | 38,7 |
| After 1st ageing | 4,4 | 12 | 24,21 | 81,8 | 50,4 |
| After 2nd ageing | 4,5 | 12,7 | 24,91 | 81,9 | 49,0 |
| After 3rd ageing | 2,9 | 11,6 | 23,81 | 87,8 | 51,3 |

FIG. 10

[Fig. 18]
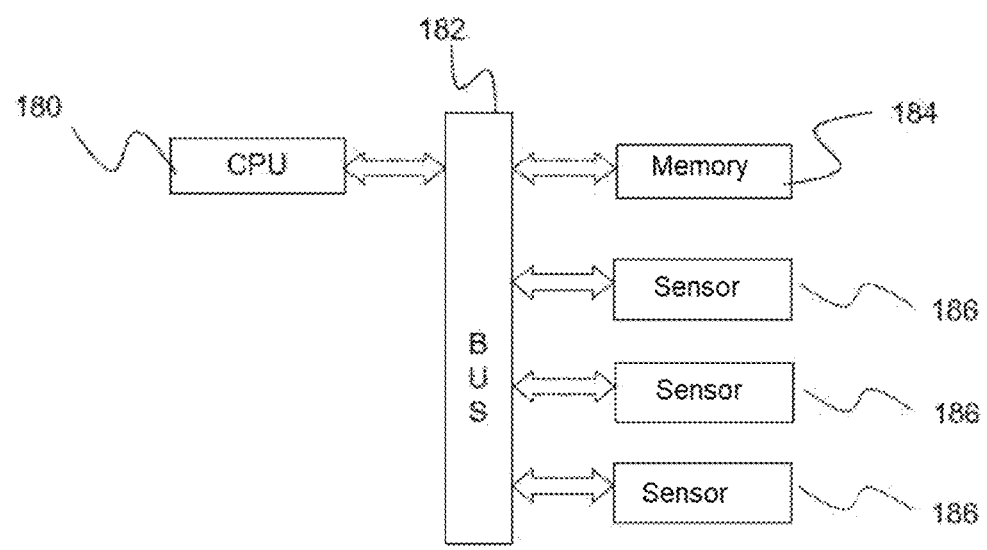

ESTIMATING THE SOH AND ESTIMATING THE SOC OF AN ELECTROCHEMICAL ELEMENT

CROSS-REFERENCE TO RELATED APPLICATIONS

This application is the national stage entry under 35 U.S.C. § 371 of International Patent Application No. PCT/FR2019/053072 filed on Dec. 15, 2019, and claims the benefit of French Patent Application No. 1873112 filed Dec. 17, 2018, the disclosures of which are incorporated herein by reference in their entirety.

TECHNICAL FIELD

The technical field of the present invention relates to methods, systems and programs for estimating the state of health (SOH) and the state of charge (SOC) of an electrochemical element for which the measurement of voltage does not enable the continuous and precise estimation of its state of charge.

PRIOR ART

An electrochemical generator, or accumulator, or element or cell is a device for producing electricity in which chemical energy is converted into electrical energy. The chemical energy consists of electrochemically active compounds disposed within the element. The electrical energy is produced by electrochemical reactions during the discharge of the element. The electrodes, disposed in a container, are electrically connected to the current output terminals which ensure electrical continuity between the electrodes and an electrical consumer load with which the element is associated.

Typically, a battery comprises a plurality of elements capable of being grouped together within the same enclosure. A battery can be divided into modules, each module being composed of a plurality of elements that are connected to each other in series and/or in parallel. The battery is intended to supply electrical energy for an exterior application. A charge circuit is generally provided to which the battery can be connected in order to recharge the elements. A management system comprising measurement sensors and an electronic control circuit, that is more or less advanced depending on the applications, may be associated with the battery.

There are known standards for calculating the State of Health (or SOH, the corresponding acronym) of an electrochemical element, and by extension of a battery. The SOH indicates the degree of aging of the element between an initial state and a state at a given time instant. The SOH of an element may be calculated either from the ratio of the impedance of the element at a given time instant to the impedance of the element in the initial state, or from the estimate of the loss of capacity by comparison with the capacity of the element in the initial state. However, these standards of calculation do not allow for in-line characterization of the causes of aging of the element; in particular, the loss of capacity of the negative electrode and the growth of the passivation layer (SEI, acronym for "solid-electrolyte interface") of a Lithium electrochemical element. For example, methods that provide the means for estimating the SOH impose full charge or discharge with restricted regimes in order to ensure a minimal precision. This has the consequence of imposing a maintenance cycle, and moreover the estimation of capacity does not provide the causes of aging.

There are also known standards for calculating the State Of Charge (or SOC, the corresponding acronym) of an element and by extension of a battery. The SOC is the quantity of energy available in the battery in relation to the energy of a fully charged battery. Typically, it is expressed as a percentage and reflects the portion of remaining energy available to the user. At the present time, the majority of SOC calculation standards are based on continuous measurement of voltage-current-temperature data. For example, it is possible to use the following two calculation modes which alternate successively. The principal mode is coulometric, that is to say that the state of charge depends directly on the counting of ampere-hours and on the battery capacity. However, this mode is very sensitive to current measurement error as well as to the estimation of capacity. Voltage drifts may occur if this mode is used alone. The second mode is generally based on measurement of voltage and uses a table of the state of charge as a function of the open circuit voltage. However, this second mode is sensitive to the estimation of resistance, and a resistance estimation error will lead to an error in estimation of the Open Circuit Voltage (or OCV, the corresponding acronym) and therefore an SOC estimation error.

There are also known elements whereof the technology is characterized by a curve of OCV as a function of SOC which exhibits a slight slope because it has at least one zone where the OCV variation as a function of the SOC either varies little and/or may be non-univocal; it is not possible to associate a voltage measurement with a state of charge. The curve of OCV as a function of SOC may be non-univocal, that is to say that there are two points on the curve which have the same ordinate but a different abscissa. The document EP-A-2 269 954 describes examples of such elements for which the no-load voltage variation as a function of the state of charge presents a zone for a state of charge comprised between approximately 30 and approximately 90% within which the no-load voltage increases at least 10 times less rapidly as a function of the mean state of charge than for a state of charge comprised between 90% and 100%. Such elements are referred to as flat profile electrochemical elements or more simply as flat profile elements. The aging will induce changes in the relationship between the OCV and the SOC.

For such flat profile elements, in zones where the rise of the curve of OCV as a function of SOC is slow, calibrating the SOC on the voltage is not possible due to the measurement uncertainty being too large. The calculation of the SOC is therefore purely coulometric. This implies that a capacity that is poorly estimated (for example because of aging of the element or even because of a current measurement error) can make up the SOC deviation during the time of voltage calibration over a curve portion that has a sufficient slope. It is known that the state of charge information provided is sufficiently precise for a portion (known as zone 4) of the curve of OCV as a function of SOC corresponding to an SOC in the vicinity of 90 to 100%. Even if the capacity were to be well estimated, the error on the current measurement would limit the number of cycles permitted without calibration in this zone 4. Current management methods for managing such elements include resetting SOC information on the voltage over zone 4, at low current in order to minimize the uncertainty of the resistance value. This may impose for certain applications a regular full charge, which is in particular not suitable for hybrid applications such as railways or buses where the constraint is on a daily basis. It is also possible to reset in Zone 1 of the curve of OCV as a function of SOC; Zone 1 corresponds to an SOC in the vicinity of around 0 to 30%. However, this implies acquiring knowledge about the error committed on the SOC by coulometry close to the end of discharge.

Therefore, there are currently no methods that can be satisfactorily adapted to be capable of estimating the state of health and the state of charge of an electrochemical element, and in particular when the electrochemical element is a flat profile element.

SUMMARY OF THE INVENTION

The present invention therefore provides a method for estimating the state of health (SOH) of an electrochemical element. The method comprises an initiation of a charge or discharge operation of the electrochemical element. The method further comprises a measurement of values representing deformations of the electrochemical element while the charge or discharge operation is being performed. The measured deformation values form a deformations image signal as a function of the quantity of electricity passing through the electrochemical element over time. The method further comprises a comparison between the deformations image signal thus formed and a reference image signal. One or more differences between the image signal and the reference image signal are obtained by the comparison. The said one or more differences characterize an estimation of the aging of the electrochemical element.

Such a method improves the estimation of the SOH of an electrochemical element because it is independent of electrical measurements to be performed directly or indirectly across the terminals of the electrochemical element. Indeed, the estimation of SOH is based on the determination of a signal which is an image of the deformations (mechanical) undergone by the electrochemical element for a given quantity of electricity that has passed through it during a charge or discharge operation. However, the formations are dependent on the aging of the electrochemical element, that is to say that the measured values characterize the aging of the element. Thus, for the same given quantity of electricity passing through an electrochemical element, the latter will have different deformations as a function of the aging of the electrochemical element. The comparison with a reference image signal of this same electrochemical element then makes it possible to estimate the aging of the electrochemical element.

As the estimate of the SOH is determined from the deformations of the element and is independent of particular electrical regimes that would apply to the element, the estimation of SOH may be carried out regardless of the intensity of the current without loss of precision. In addition, the estimation of SOH according to the invention requires only a partial charge or discharge.

According to various different embodiments, any combination comprising at least one of the following characteristic features may be implemented:
the one or more differences obtained by the comparison characterize an estimation of a growth of a passivation layer (SEI) $SEI_{Growth}[N]$ and an estimation of a negative capacity loss $C_{neg\_loss}[N]$;
the comparison further comprises the calculation of an estimate of the real capacity of the electrochemical element $Capa_{batt}[N]$ by making use of the formula $Capa_{batt}[N]=Capa_{batt}[N-1]-(SEI\_Growth[N]+C_{neg\_loss}[N])$ where $Capa_{batt}[N-1]$ is a reference capacity value;

the estimate of the growth of a passivation layer (SEI) $SEI_{Growth}[N]$ is calculated by the formula $SEI\_Growth[N]=Ah_{PeakMin}[N-1]-Ah_{PeakMin}[N]$ where $Ah_{PeakMin}[N-1]$ is a first value representing a quantity of electricity that has passed through the electrochemical element for a minimum value of the reference image signal, $Ah_{PeakMin}[N]$ is a second value representing a quantity of electricity that has passed through the electrochemical element for a minimum value of the deformations image signal, and wherein the estimate of the negative capacity loss $C_{neg\_loss}[N]$ is calculated by the formula $C_{neg\_loss}[N]=(Ah_{PeakMax}[N-1]-Ah_{PeakMin}[N-1])-(Ah_{PeakMax}[N]-Ah_{PeakMin}[N])$ where $Ah_{PeakMin}[N-1]$ is the first value representing a quantity of electricity that has passed through the electrochemical element for the minimum value of the reference image signal, $Ah_{PeakMin}[N]$ is the second value representing a quantity of electricity that has passed through the electrochemical element for the minimum value of the reference image signal, $Ah_{PeakMax}[N-1]$ is a third value representing a quantity of electricity that has passed through the electrochemical element for a maximum value of the reference image signal, $Ah_{PeakMax}[N]$ is a fourth value representing a quantity of electricity that has passed through the electrochemical element for a maximum value of the deformations image signal;
the reference image signal is obtained by following the same steps as for the image signal calculated during a preceding charge or discharge operation;
the preceding charge or discharge operation is the first charge or discharge operation of the electrochemical element;
a calculation of the time derivative of the reference image signal;
and wherein the comparison comprises the comparison between the calculated derivative and a reference derivative.

The present invention also provides a method for estimating the state of charge (SOC) of an electrochemical element. The method comprises an initiation of a charge or discharge operation of the electrochemical element. The method further comprises a measurement of values representing deformations of the electrochemical element while the charge or discharge operation is being performed. The measured deformation values form a deformations image signal as a function of the quantity of electricity passing through the electrochemical element over time. A comparison is performed between the deformations image signal and a reference image signal. One or more differences are obtained by the comparison. The said differences characterize an estimation of aging of the electrochemical element. The method in addition includes the determination of a range of state of charge values (SOC) bounded by a first value $SOC_{PeakMin}$ that represents the current SOC of the element for a minimum value of the deformations image signal, and a second value $SOC_{PeakMax}$ that represents the current SOC of the element for a maximum value of the deformations image signal, and outside of the said range the calibration of the open circuit voltage (OCV) of the electrochemical element is achievable.

Such a method improves the estimation of the SOC of an electrochemical element because it is based on the method for estimating the SOH previously described above; that is to say that the estimation of the SOC is also independent of electrical measurements to be performed directly or indirectly across the terminals of the electrochemical element. Thus, just as with the estimation of the SOH, the estimation of the SOC may be carried out regardless of the intensity of the current without loss of precision, and it may be carried out with a partial charge or discharge of the element without imposing a maintenance cycle. In addition, by using the measurement of deformation, the calculation of SOC is improved because a range of SOC values outside of which open circuit voltage (OCV) calibration is possible, is determined with precision via precise reference points. The elements, that have a curve of OCV as a function of SOC which is non-univocal, happen to have the zone of uncertainty reduced. By extension, this allows for a precise calculation of the SOC outside of Zones 1 and 4. Thus, the functional of the element is improved by overcoming the constraints of calibration of the SOC on the voltage measurement outside of the plateau zones for the elements with phase transition materials. The method thus makes it possible to permit long-term cycling in the plateau zones without SOC drifts linked to the current measurement error. The method allowing for in-line recalibration of the OCV, the precision of the SOC is improved during calibration on the voltage measurement.

According to various different embodiments, any combination comprising at least one of the following features may be implemented:

calibration of the open circuit voltage (OCV) of the electrochemical element;

the calibration further comprises the estimation of the aging of the electrochemical element by an estimation of a growth of a passivation layer (SEI) $SEI_{Growth}[N]$ and an estimation of a negative capacity loss $C_{neg\_loss}[N]$, and wherein the calibration of the open circuit voltage (OCV) of the electrochemical element comprises the calibration of the open circuit voltage (OCV) of the negative electrode of the electrochemical element by performing the calculation of a loss of active material (LAM) and/or a loss of lithium inventory (LLI) corresponding to the estimation of the growth of the passivation layer (SEI) $SEI_{Growth}[N]$ and of the estimation of the negative capacity loss $C_{neg\_loss}[N]$; the correction of the open circuit voltage (OCV) of the negative electrode as a function of the calculation of the loss of active material (LAM) and/or the loss of lithium inventory (LLI);

the determination of a range of values includes for a discharge operation of an electrochemical element the calculation of the value $SOC_{PeakMin}[N]$ by the formula $SOC\ PeakMin[N]=100-100*(Ah_{PeakMin}[N]/Capa_{batt}[N])$; the calculation of the value $SOC_{PeakMax}[N]$ by the formula $SOC_{PeakMax}[N]=100-100*(Ah_{PeakMax}[N]/Capa_{batt}[N])$ and wherein the determination of a range of values includes for a charge operation of the electrochemical element, the calculation of the minimum value of the range $SOC_{PeakMin}[N]$ by the formula $SOC_{PeakMin}[N]=100*(Ah_{PeakMin}[N]/Capa_{batt}[N])$; the calculation of the maximum value of the range $SOC_{PeakMax}[N]$ by the formula $SOC_{PeakMax}[N]=100*(Ah_{PeakMax}[N]/Capa_{batt}[N])$, where $Ah_{PeakMin}[N]$ is the second value representing a quantity of electricity that has passed through the electrochemical element for the minimum value of the reference image signal; $Ah_{PeakMax}[N]$ is a fourth value representing a quantity of electricity that has passed through the electrochemical element for a maximum value of the deformations image signal; and $Capa_{batt}[N]$ is an estimate of the actual capacity of the electrochemical element;

the estimation of the aging of the electrochemical element includes an estimation of a growth of a passivation layer (SEI) $SEI_{Growth}[N]$ and an estimation of a negative capacity loss $C_{neg\_loss}[N]$, and wherein the comparison in addition includes the calculation of an estimate of the actual capacity of the electrochemical element $Capa_{batt}[N]$ by making use of the formula $Capa_{batt}[N]=Capa_{batt}[N-1]-(SEI_{Growth}[N]+C_{neg\_loss}[N])$ where $Capa_{batt}[N-1]$ is a reference capacity value, $SEI_{Growth}[N]$ is the estimate of the growth of the passivation layer (SEI), $C_{neg\_loss}[N]$ is the estimate of negative capacity loss.

The present invention also provides a computer program comprising the program code instructions for the execution of the method for estimating the state of health (SOH) and/or state of charge (SOC) of an electrochemical element.

The invention also provides an information storage medium that is computer readable on which the computer program is saved and stored.

Also provided is a system that comprises a deformation sensor for detecting deformations of the electrochemical element, a management unit for managing the electrochemical element, the management unit being in communication with the sensor and comprising a computing unit coupled to a memory storage unit, with the memory storage unit storing the computer program and being able to store at least the values of the reference image signal, values of the calculated image signal, and values of the comparison.

The system may in addition comprise a deformation sensor that is a strain gauge, which delivers a voltage that forms the deformations image signal as a function of the quantity of electricity passing through the electrochemical element over time.

Also provided is an assembly that includes the system and a battery comprising at least one electrochemical element coupled with the deformation sensor.

The assembly may further be such that the electrochemical element included is of the type that has a state of charge curve (OCV) comprising a flat zone wherein the relationship between the state of charge and/or the open circuit voltage (OCV) is non-bijective.

BRIEF DESCRIPTION OF THE DRAWINGS

The embodiments of the invention will now be described by means of non-limiting examples of the invention, and with reference to the figures, where:

FIG. 9 is an example of values calculated from the deformations image signals of FIG. 8 in order to estimate the SOH;

FIG. 10 is an example of values calculated from the deformations image signals of FIG. 8 in order to estimate the SOC;

FIG. 18 is an example of a system for estimating the SOH and/or SOC.

DESCRIPTION OF EMBODIMENTS OF THE INVENTION

The present invention relates to the estimation of the state of health (SOH) and the state of charge (SOC) of an electrochemical generator, also referred to by the terms accumulator, or electrochemical element, or even element or cell. These terms denote a device for producing electricity in which chemical energy is converted into electrical energy, and shall be considered to be synonymous hereinafter.

The term 'open circuit voltage' (or indeed no-load voltage) is understood to refer to the voltage measured across the terminals of the element when the latter is not drawing any current ("open circuit voltage" in English and also corresponding to French term "tension en circuit ouvert"; according to the definition 482-03-32 of the standard "CEI 60050-482: 2004", "Vocabulaire électrotechnique International partie 482: piles et accumulateurs électriques").

The term curve of OCV as a function of SOC is understood to refer to the variation in voltage as a function of the state of charge, or more simply put, the curve of OCV as a function of SOC is a table that relates OCV measurement points as a function of SOC values.

The present invention may be applicable to a particular type of electrochemical element whose curve of OCV as a function of SOC includes either a curve portion with a slight slope, and/or a curve portion with zero slope, and/or a curve portion which is not univocal. This type of electrochemical element is also known by the term "flat profile electrochemical element" or more simply "flat profile element"; the flat profile therefore corresponding to the curve portion having the slight slope, and/or the curve portion having the zero slope, and/or the curve portion that is not univocal. More generally, a flat profile electrochemical element is an electrochemical element of which at least a portion of the variation in the OCV is included in the measurement error of the sensor being used to measure and/or estimate the OCV, and/or a portion of the curve is not univocal.

Figure 1:
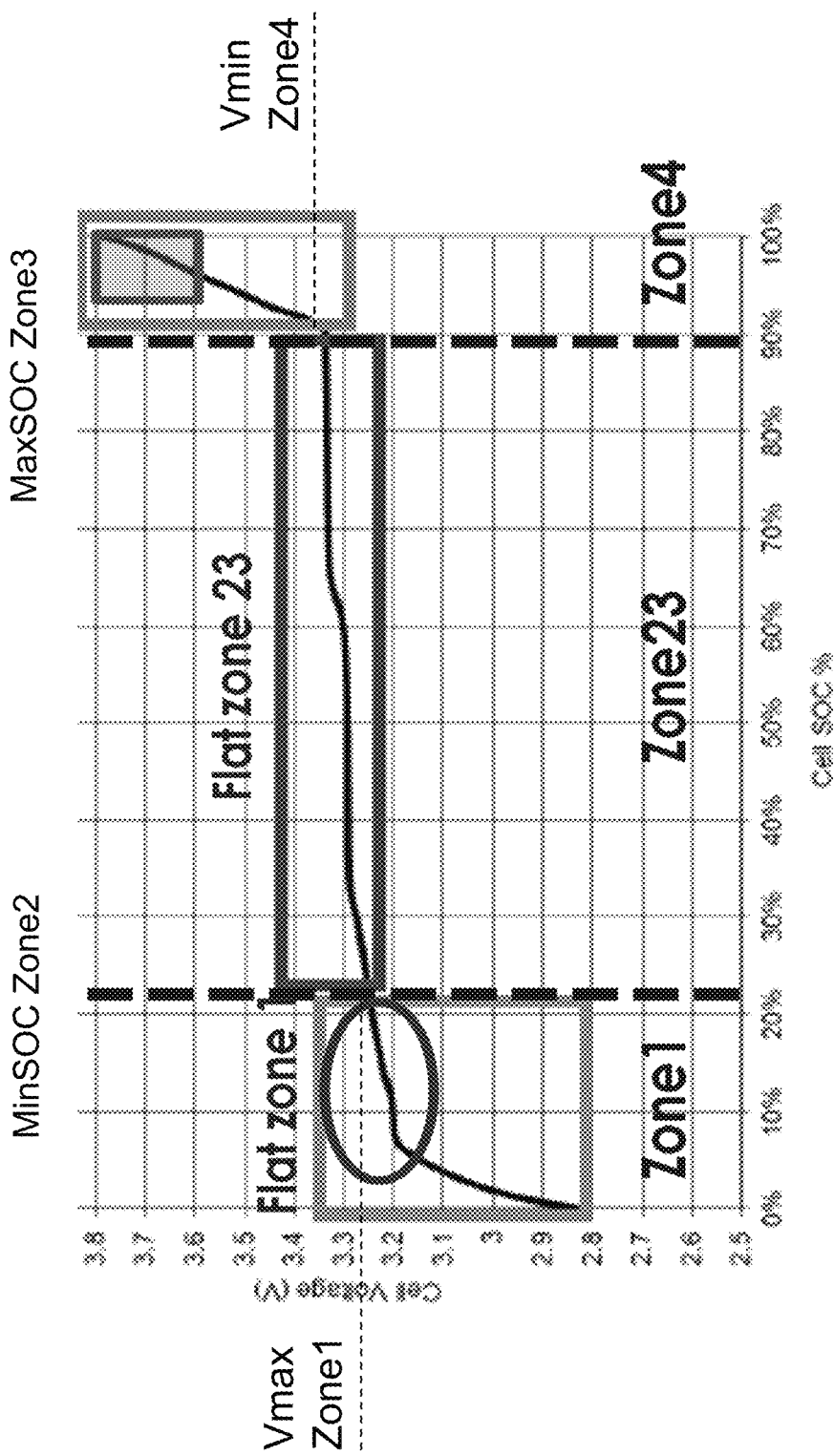
FIG. 1 is an example of an electrochemical element whose curve of OCV as a function of SOC includes a flat zone.

FIG. 1 is a schematic example of a curve of OCV as a function of SOC that includes at least one flat profile. In this example, the element is a Lithium-ion element, whereof one positive electrode comprises an electrochemically active material of such types as lithiated phosphate or as described in the document EP-A-2 269 954. In the example shown in FIG. 1, the curve may be divided into four zones. The precision of measurement entails zones 2 and 3 being merged and forming one single plateau or flat zone (Zone 23). The curve of OCV as a function of SOC for Zone 23 may be non-univocal, that is to say, there are two points on the curve that have the same ordinate (a same OCV value) but different abscissa (at least two different SOC values). Zone 1 also has a plateau, which greatly reduces the sloping zone where a calibration on the voltage is possible. The plateau of Zone 1 is the portion of the curve that is comprised within the oblong shape in FIG. 1; moreover, this Zone 1 may be the most impacted by the aging of the element. Zone 4 is the zone that comprises a slope sufficiently steep so as to enable an accurate measurement of the state of charge information.

The three main zones shown in FIG. 1 will now be discussed in greater detail. Zone 1: it corresponds to a voltage less than or equal to VmaxZone1. The value VmaxZone1 corresponds to a state of charge equal to MinSOCZone2. VmaxZone1 is situated generally between 3 and 3.30V and typically amounts to 3.30V. MinSOCZone2 is situated generally in the range from 15 to 30%, typically 30%. In Zone 1, the voltage varies almost proportionally with the state of charge; that is to say, a given voltage of the element corresponds to a given state of charge. Zone 1 is further subdivided into a first state of charge zone comprised between 0 and less than 10%, in which the voltage of the element varies by more than 300 mV and a second state of charge zone comprised between typically 10% and typically 30%, in which the voltage varies less rapidly as a function of the state of charge, for example by around 100 mV for an increase in state of charge of 20%. This second charge zone is the portion of the curve which is comprised within the oblong shape in FIG. 1.

Zone 23: it corresponds to a voltage greater than VmaxZone1 and less than VminZone4. VminZone4 is situated generally between 3.35 and 3.45V, and typically amounts to 3.40V. The value VminZone4 corresponds to a state of charge equal to MaxSOCZone3. MaxSOCZone3 is situated generally in the range from 80 to 95%, being typically 90%. The Zone 23 typically corresponds to the zone of voltages comprised between 3.30 V and 3.40 V corresponding to a state of charge comprised typically between 20% and typically 90%. It may be noted that there is an almost null variation in voltage of the element for a state of charge comprised between 30% and 60% and for a state of charge comprised between 65% and 90%. In Zone 23, the voltage of the element varies little, typically of the order of 100 mV for a state of charge comprised between approximately 30 and approximately 90%. This results in high imprecision of the state of charge in Zone 23 since a given value of voltage can correspond to a state of charge comprised within a wide range from 30 to 90%. Zone 23 is subdivided into two sub-zones; a first sub-zone: Zone 2 ranging from MinSOCZone2 to MaxSOCZone2, that is to say from 22 to 60%; and a second sub-zone, Zone 3 ranging from MinSOCZone3 to MaxSOCZone3, that is to say from 65 to 90%. The Zones 2 and 3 join together towards a state of charge comprised between 60 and 65%.

Zone 4: it corresponds to a voltage greater than or equal to VminZone4. The value VminZone4 corresponds to a state of charge equal to MaxSOCZone3. VminZone4 corresponds to a state of charge of approximately 90%. In this zone, the voltage varies proportionally with the state of charge. It varies by approximately at least 300 mV. A given voltage of the element corresponds to a given state of charge.

The example presented in FIG. 1 is non-limiting in the sense that it illustrates only one example of a flat profile element. In a general manner, a flat profile element is an electrochemical element whereof the positive active material has a charge profile in which the voltage variation as a function of the state of charge is between a state of charge greater than MinSOCzone2 corresponding to a predetermined voltage VmaxZone1 and a state of charge lower than MaxSOCzone3 corresponding to a voltage VminZone4. The value of the open circuit voltage OCV varies between VmaxZone1 and VmaxZone2 and this variation is comprised in the measurement error of a voltage sensor; for example, the precision of the sensor is not sufficient for measuring the variations in OCV in Zone 23.

Examples of estimation of the state of health (SOH) of an electrochemical element are discussed here below.

In a first step, a charge operation or a discharge operation of the electrochemical element is initiated. The charge or discharge operation that has been initiated will be executed until the data that enable producing an estimate of the SOH are obtained. One or more estimates of SOH may be produced during a charge or discharge operation.

During a charge or discharge operation, a measurement of values representing deformations of the electrochemical element is carried out (S300). It is equivalent to saying that measurements of values of the deformations of the electrochemical element are carried out. The term "deformations of the electrochemical element" is understood to refer to variations in the relative dimensions of the electrochemical element. The deformation of an electrochemical element occurring during electrochemical cycling is a known physical phenomenon; for example, the deformation of a lithium-ion element.

The values of deformations measured form a deformations image signal as a function of the quantity of electricity passing through the electrochemical element over time. In fact, the deformations are measured during and for a charge operation or indeed a discharge operation, this operation being carried out over a given period of time. Thus, progressively as the charge or discharge operation is being carried out, each value representing a variation in the relative dimension of the element is measured as a function of a quantity of electricity that has passed through the element since initiation of the operation. Alternatively, each value may be measured as a function of the quantity of electricity that has passed through the element from a first point in time other than the start (initiation) of the charge or discharge operation.

The measurements of the deformations of the electrochemical element may be carried out with any sensor capable of detecting and producing a value representing a deformation.

In examples, a sensor may be an extensometer of the type such as resistance wire extensometer (also known as deformation) which translates a deformation of the electrochemical element into an electrical voltage value. A resistance wire extensometer can be used to measure small deformations.

Figure 3:
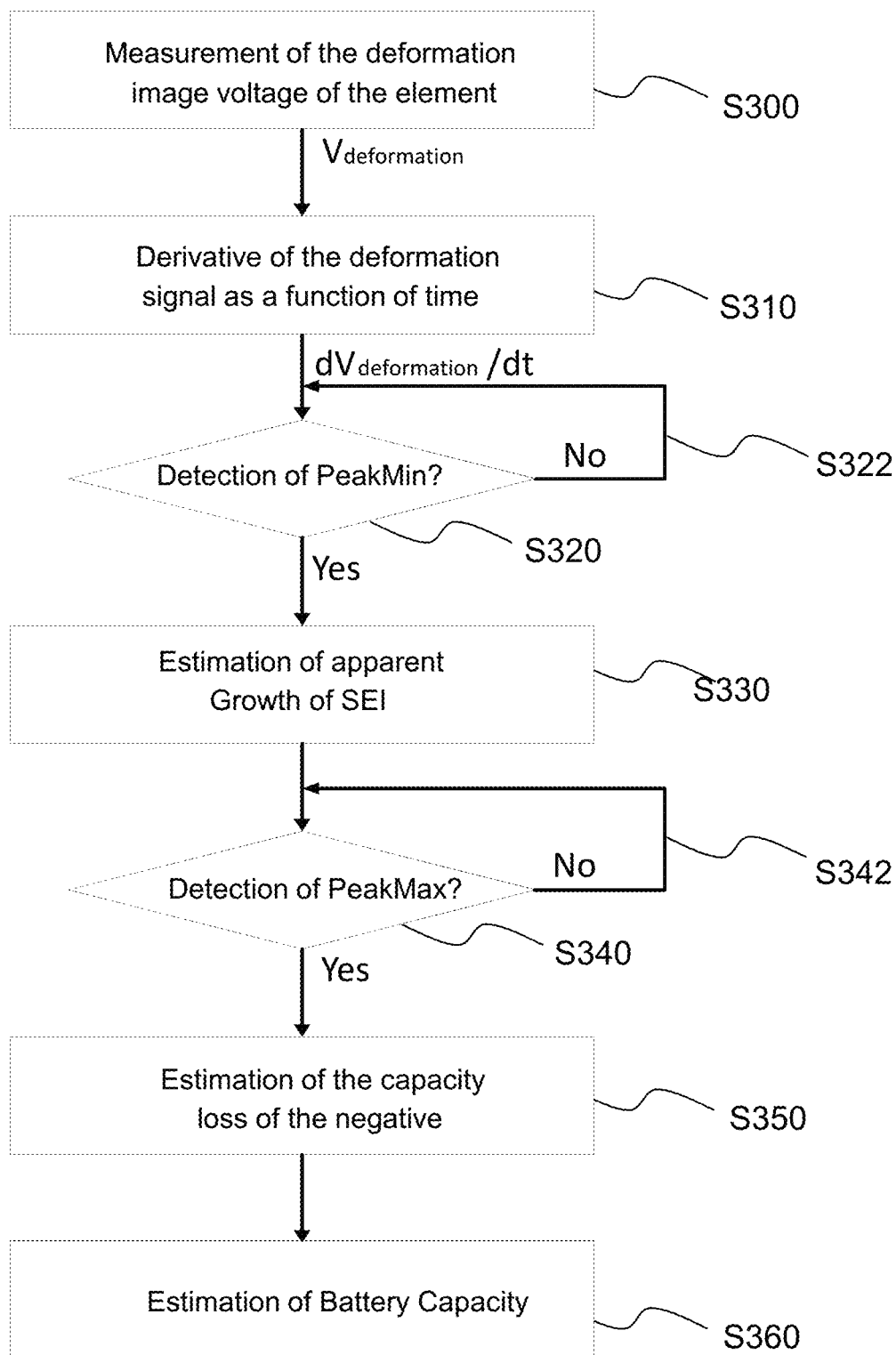
FIG. 3 is an example of an algorithm flowchart for calculation of the estimate of the SOH.

In the example shown in FIG. 3, in step S300, a deformations image signal as a function of the quantity of electricity passing through the electrochemical element over time is obtained during a discharge operation of an electrochemical element. In this example, the deformations measured are translated into values of voltage as a function of time. While the deformations are being measured, the quantity of electricity that passes through the electrochemical element as a function of time is also measured. From these two measurements, that is to say the deformations over time and the quantity of electricity passing the element at the same time, the deformations image signal is obtained (or calculated).

Figure 2:
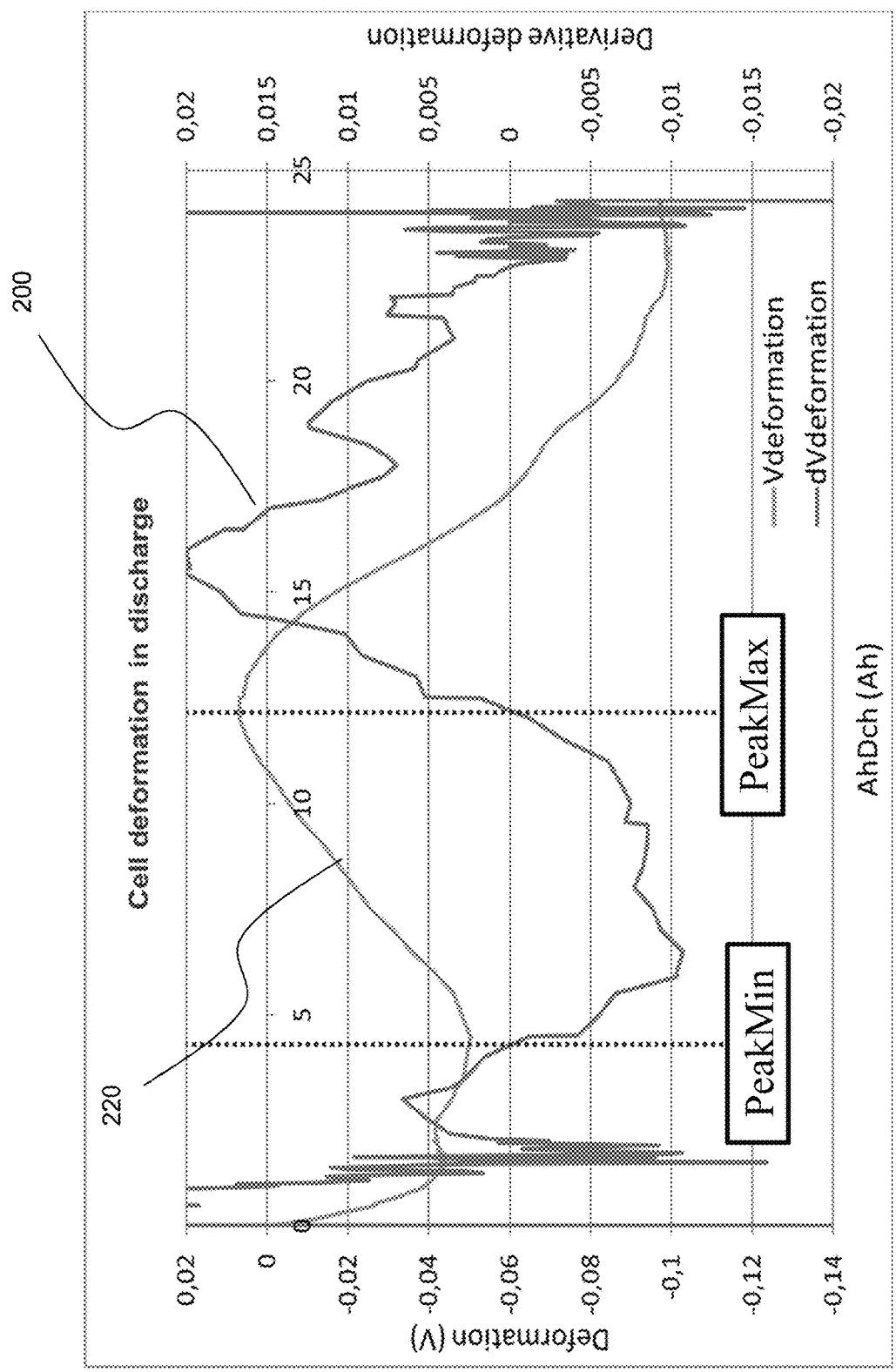
FIG. 2 is an example of a deformations image signal of an element.

FIG. 2 is a graphical representation of a deformations image signal 200 of an element during a discharge operation. In this example, the deformations image signal is that of an electrochemical element having a cylindrical shaped form, it being understood that the method according to the invention may be applied regardless of the format of the electrochemical element. The deformations measured are translated into voltage values. The deformations image signal 200 evolves as a function of the quantity of electricity passing through the element for a discharge at C. The quantity of electricity is typically expressed in ampere hours (Ah).

After obtaining the deformations image signal, the latter is compared with a reference image signal. The comparison makes it possible to obtain one or more differences that characterize an estimate of the aging of the electrochemical element. The comparison between the two signals may make use of, but is not limited to, methods of qualitative comparisons of the two signals, methods of calculation between the values of the two signals. The one or more differences obtained—for example in the behaviour of the curves over a range of values on the abscissa, or indeed even the values obtained by means of the comparison of values of the two curves—represent structural modifications of the constituents (electrodes, separator, etc) of the electrochemical element for a given quantity of electricity that has passed through the electrochemical element. These structural modifications are related to past uses of the element, and are therefore indicative of the state of health of the electrochemical element. In other words, the evolution of deformations between two identical charge or discharge operations is an indicator, or even characterizes, the aging of an electrochemical element.

The comparison between the deformations image signal (formed in step S300) and the reference image signal is performed between two image signals for which the same electrochemical element has had pass therethrough at most an identical quantity of electricity; The term "Identical" can signify substantially the same, for example with a difference preferably between ±5%, and up to ±20%. The quantity of electricity that passes through the element in order to obtain the deformations image signal and the reference image signal makes it possible to obtain for a local minimum and a maximum of each of the two image signals, the full charge and the full discharge not constituting each of the local minimum and maximum.

In examples, similar initial conditions for the formation of the two image signals to be compared may be set. For example, the two image signals may be obtained from the same charge reference point, which enables performing the comparison with a deformations image signal and a reference image signal that have been obtained for an electrochemical element under similar electrical conditions, which significantly enhances the accuracy of the estimation of the aging of the electrochemical element.

In examples, the reference image signal is obtained according to the same method as that used to obtain the deformations image signal. As stated previously, the same electrochemical element has passing therethrough the maximum amount of identical electricity for the formation of the two signals. This quantity of electricity may have passed through the element with the same C/n regime, or indeed even with two respective regimes. If the deformations image signal is obtained for a discharge operation, the reference signal will also have been obtained for a discharge operation, and vice versa.

The one or more difference(s) obtained by means of the comparison make it possible to obtain an image of the evolution of the structural modifications of the constituents of the element between two operations of the same type, whether or not successive. It is understood that the differences measured between two successive operations can provide the ability to detect severe changes in the element, for example the detection of premature or abnormal aging of the element.

In examples, the reference image signal is obtained for a first or one of the first charge or discharge operations of the electrochemical element. "One of the first operations" can be a charge or discharge operation relative to an initial state of the electrochemical element. The initial state may be that of a new element, or of an already aging element (that is to say used), or of a second life element (that is to say for a new use). In all the cases, the initial state is the placing in use of the element. Thus, the reference image signal can be obtained during the first instance of use or one of the first instances of use of the electrochemical element.

In examples, the comparison between the image signal and the reference image signal may be performed by using time derivatives of each of the two signals. This makes it possible, if necessary, to facilitate the identification of particular values such as the minimum and maximum values of each of the two signals. This also makes it possible to facilitate the calculation of the comparison. FIG. 2 illustrates this in which the time derivative 220 of the signal 200 is shown. The oscillations that the image signal experiences (for example for the left and right portions of the image signal 200) are smoothed, facilitating the calculation of the comparison.

In the example shown in FIG. 3, in the step S310, the time derivative is calculated after the acquisition of the image signal.

In examples, the estimation of the aging of the element from the one or more differences may include the calculation of an estimate of a growth of a passivation layer (SEI) $SEI_{Growth}[N]$ and the calculation of an estimate of a negative capacity loss $C_{neg\_loss}[N]$. The growth of SEI and the negative capacity loss are the two main physico-chemical mechanisms that most affect the aging of an electrochemical element. The estimation thereof from the measurement of deformations of the element provides a means for accurately estimating the SOH of the electrochemical element.

In examples, the SOH is estimated from the estimate of the loss of capacity $Capa_{batt}[N]$ by comparison with the reference capacity $Capa_{batt}[N-1]$ of the element. The reference capacity $Capa_{batt}[N-1]$ of the electrochemical element may be its capacity in the initial state, or indeed even its capacity after one of the first charge or discharge operations relative to an initial state, as previously discussed. In these examples, an estimate of the capacity of the electrochemical element $Capa_{batt}[N]$ can be calculated by making use of the formula:

$$Capa_{batt}[N]=Capa_{batt}[N-1]-(SEI_{Growth}[N]+C_{neg\_loss}[N]) \quad (eq.\ 1)$$

where $Capa_{batt}[N-1]$ is a reference capacity value of the element. $Capa_{batt}[N]$ is also referred to the actual capacity of the element because it estimates the energy that the element that has aged is able to store.

With reference to the steps S320 to S360 of FIG. 3, an example will now be discussed in which the SOH is obtained by means of a calculation of the estimate of the real capacity of the electrochemical element according to the formula (eq. 1). In this example, the calculation of an estimate of a growth of a passivation layer (SEI) $SEI_{Growth}[N]$ and the calculation of an estimate of a negative capacity loss $C_{neg\_loss}[N]$ are performed. In addition, the comparison between the image signal and the reference image signal is performed with the time derivatives of these two signals.

The steps S320 to S330 illustrate an example of calculation of the estimate of the growth of the passivation layer (SEI), denoted $SEI_{Growth}[N]$. In step S320, a null value of the time derivative of the deformations image signal is identified. This null value makes it possible to identify a local minimum of the deformation image signal (S300). The identification of this null value of the derivative is effected using any known mathematical method. This local minimum corresponds to a value denoted as $Ah_{PeakMin}[N]$ which represents a quantity of electricity that has passed through the electrochemical element. A minimum corresponding to the electrochemical element in full charge or in full discharge is excluded. The dimension of $Ah_{PeakMin}[N]$ is a unit of charge, typically ampere hours (Ah). It should be understood that in the examples where step S310 is not carried out, the local minimum is directly calculated from the image signal by using any known method.

As long as a minimum value could not be identified (S322), the step S320 is repeated. This may be the case for example when the duration over which the charge or discharge operation is carried out, is not sufficient to obtain a minimum, excluding full charge and full discharge of the electrochemical element.

At the same time as step S320-S322 is being carried out, or even prior, or even subsequent thereto, a null value of the time derivative of the image signal reference is identified. This null value makes it possible to identify a local minimum of the reference image signal. The identification of this null value of the time derivative of the reference image signal may be calculated by using the same method as that for the deformations image signal. A minimum corresponding to the electrochemical element in full charge or in full discharge is also excluded. This local minimum corresponds to a value denoted as $Ah_{PeakMin}[N-1]$ which also represents a quantity of electricity that has passed through the electrochemical element and is of the same dimension as $Ah_{PeakMin}[N]$. It should be understood that in the examples where step S310 is not carried out, the local minimum is directly calculated based on the reference image signal by using any known method.

Subsequently, in step S330, $SEI_{Growth}[N]$ is calculated by the formula (eq. 2)

$$SEI_{Growth}[N]=Ah_{PeakMin}[N-1]-Ah_{PeakMin}[N] \quad (eq.\ 2)$$

where $Ah_{PeakMin}[N-1]$ is a first value representing the quantity of electricity that has passed through the electrochemical element for a null value of the derivative of the reference image signal, and $Ah_{PeakMin}[N]$ is a second value representing the quantity of electricity that has passed through the electrochemical element for a null value of the derivative of the deformations image signal calculated in step S310.

It should be understood that in the examples where step S310 is not carried out, $Ah_{PeakMin}[N-1]$ is a first value representing the quantity of electricity that has passed through the electrochemical element for a local minimum value of the reference image signal, and $Ah_{PeakMin}[N]$ is a second value representing the quantity of electricity that has passed through the electrochemical element for a local minimum value of the deformations image signal calculated in step S300.

The steps S340 to S350 illustrate an example of calculation of the estimate of the negative capacity loss, denoted as $C_{neg\_loss}[N]$. In step S340, a second null value of the time derivative of the deformations image signal is identified. This null value makes it possible to identify a local maximum of the deformation image signal (S300). It is calculated by using any known mathematical method. This local maximum corresponds to a value denoted as $Ah_{PeakMax}[N]$ which represents a quantity of electricity that has passed through the electrochemical element; the dimension of $Ah_{PeakMax}[N]$ is a unit of charge, typically ampere hours (Ah).

As long as a maximum value could not be identified, the step S340 is repeated (S342). This may be the case, for example, when the duration over which the charge or discharge operation is carried out is not sufficient to obtain a maximum, the element in full charge or in full discharge not constituting either a local minimum or maximum.

At the same time as step S340-S342 is being carried out, or even prior, or even subsequent thereto, a second null value of the time derivative of the signal reference image is identified. This second null value makes it possible to identify a local maximum of the image signal (S300). A maximum corresponding to the electrochemical element in full charge or in full discharge is also excluded. The identification of this null value of the derivative may be performed by using the same method as that for the deformations image signal or any other method. The point on the curve of the reference image signal for which this local maximum is reached is denoted as $Ah_{PeakMax}[N-1]$. $Ah_{PeakMax}[N-1]$ also represents a quantity of electricity that has passed through the electrochemical element and is of the same dimension as $Ah_{PeakMax}[N]$. It should be understood that in the examples where step S310 is not carried out, the local maximum is directly determined based on the deformations image signal by using any known method.

Subsequently, in step S350, $C_{neg\_loss}[N]$ is calculated by the formula (eq. 3)

$$C_{neg\_loss}[N]=(Ah_{PeakMax}[N-1]-Ah_{PeakMin}[N-1])-(Ah_{PeakMax}[N]-Ah_{PeakMin}[N]) \quad \text{(eq. 3)}$$

where $Ah_{PeakMin}[N-1]$ is a first value representing the quantity of electricity that has passed through the electrochemical element for a first null value of the derivative of the reference image signal, and $Ah_{PeakMin}[N]$ is a second value representing the quantity of electricity that has passed through the electrochemical element for a first null value of the derivative of the deformations image signal, $Ah_{PeakMax}[N-1]$ is a third value representing the quantity of electricity passing through the electrochemical element for a second null value of the derivative of the reference image signal, and $Ah_{PeakMax}[N]$ is a fourth value representing the quantity of electricity passing through the electrochemical element for a second null value of the derivative of the deformations image signal.

It should be understood that in the examples where step S310 is not carried out, $Ah_{PeakMax}[N-1]$ is a third value representing the quantity of electricity that has passed through the electrochemical element for a maximum local value of the reference image signal, and $Ah_{PeakMax}[N]$ is a fourth value representing the quantity of electricity that has passed through the electrochemical element for a local maximum value of the deformations image signal calculated in step S300.

In FIG. 3, the calculation of $C_{neg\_loss}[N]$ is performed after the calculation of $SEI_{Growth}[N]$. It should be understood that it is also possible to calculate $SEI_{Growth}[N]$ after $C_{neg\_loss}[N]$, or even at the same time.

A local minimum and a local maximum respectively of the image signal and the reference image signal are therefore identified. In examples, they are identified by looking for two null values of the derivative for each of the images, and in other examples they are identified directly from the two curves. The calculation of $C_{neg\_loss}[N]$ performed with eq. 3 only requires the identification of the minimum and the maximum on each of the two curves of the two signals. Thus, the measurement of values representing deformations of the electrochemical element may be stopped as soon as the deformations image signal comprises a minimum and maximum value, that is to say, as soon as two null values of the derivative have been identified, with the states of full charge and full discharge of the element not constituting either a local minimum or maximum. In addition, since the quantity of electricity that has passed through the electrochemical element in order to obtain the deformation image signal and the reference image signal is at most substantially the same, the minimum value and the maximum value of the deformations image signal may be identified as soon as this quantity of electricity has actually passed through the element during the measurement of deformations.

In step S360, the real capacity of the electrochemical element is estimated by making use of the formula eq. 1. Thus, the comparison between the time derivative of the image signal and the time derivative of the reference image signal is obtained for two particular points on each of these two curves. This selection of the local minimum and maximum of the derivative of the image signal and of the derivative of the reference image signal facilitates the calculation of the comparison which is performed only for these two particular points. In addition, this selection of particular points makes it possible to determine the $SEI_{Growth}[N]$ and the $C_{neg\_loss}[N]$ which are the two main causes of aging of an electrochemical element, in particular for electrochemical elements that have a flat profile, and are therefore the most suitable for characterizing the aging of the element. Thus, the differences obtained thanks to the comparing of the local minima and maxima of the image signal and reference image signal produce an estimate of the aging of the electrochemical element.

$Capa_{batt}[N-1]$ is a reference capacity value. This value may be the theoretical value of the capacity of the element. It may be the value of the capacity of the initial element, or even the capacity of the near-initial element. It may also be calculated in the same manner as $Capa_{batt}[N]$; for example, $Capa_{batt}[N-1]$ is calculated from the reference image signal. $Capa_{batt}[N]$ and $Capa_{batt}[N-1]$ are similarly dimensioned, with the dimension being a unit of charge, typically ampere hours (Ah).

In examples, $Capa_{batt}[N]$ may be calculated by taking into account only $SEI_{Growth}[N]$ or else only $C_{neg\_loss}[N]$. This makes it possible to obtain an approximation of the capacity the electrochemical element.

The values of $SEI_{Growth}[N]$ or $C_{neg\_loss}[N]$ may be estimated individually in order to determine the state of degradation of the electrochemical element.

Figure 4:
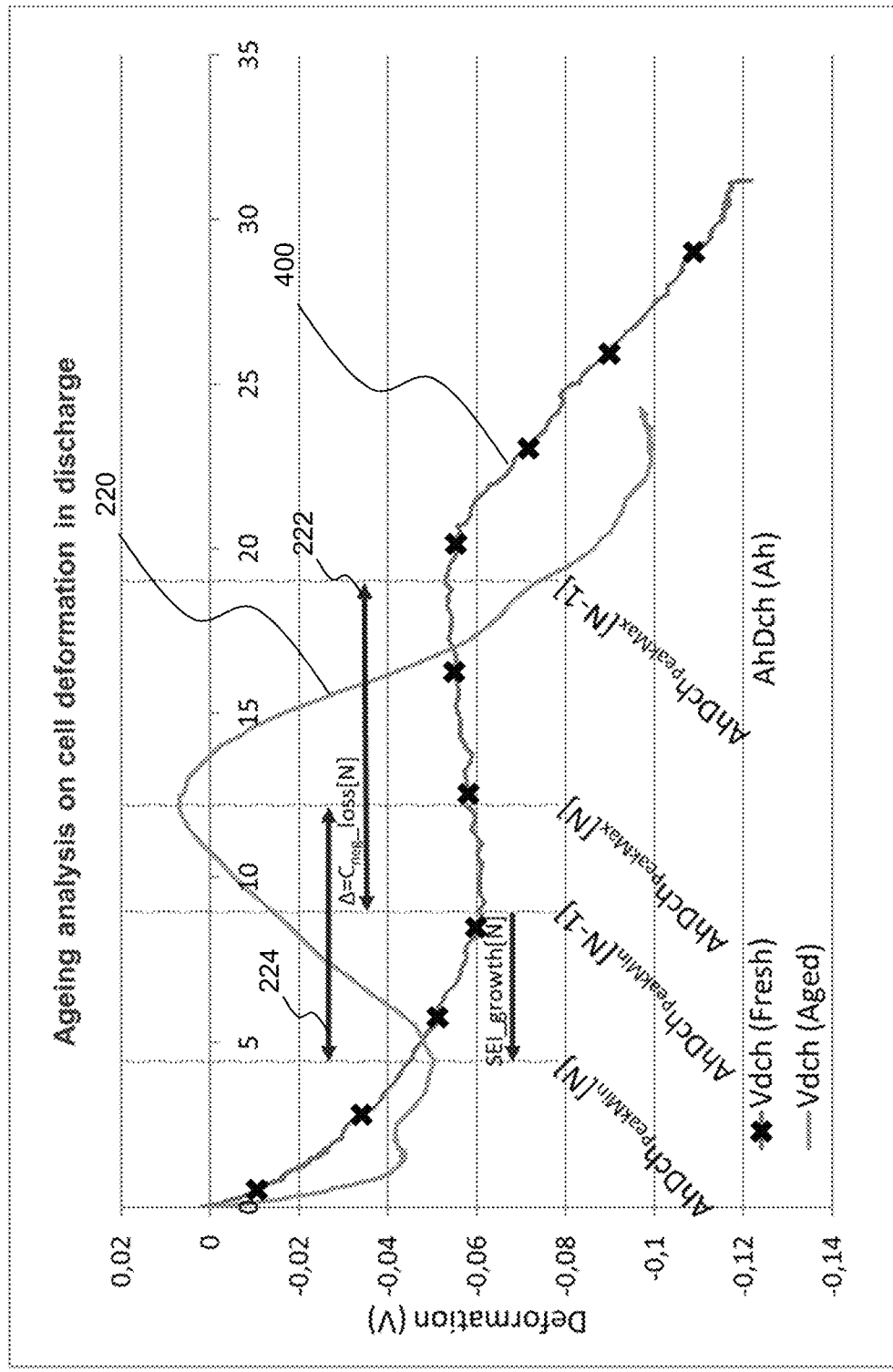
FIG. 4 is an example illustrating the steps in FIG. 3.

FIG. 4 illustrates the example shown in FIG. 3. The curve 220 is the same as that discussed with reference to FIG. 2 and represents the deformation of the image signal of an aged electrochemical element having a cylindrical shaped form. The curve 400 represents the image signal of this same electrochemical element in the initial, or near initial state. The curve 400 in this example is therefore a reference image signal with which the curve 220 is compared. The displacement to the left of the local minimum $Ah_{PeakMin}[N]$ of the curve 220 as compared to the local minimum $Ah_{PeakMin}[N-1]$ of the curve 400 is an estimator of the growth of the SEI. The double arrow 222 illustrates the portion of the curve 400 corresponding to $(Ah_{PeakMax}[N-1]-Ah_{PeakMin}[N-1])$ and the double arrow 224 illustrates the portion of the curve 220 corresponding to $(Ah_{PeakMax}[N]-Ah_{PeakMin}[N])$. The estimate of $C_{neg\_loss}$ is represented by the overlap of the two double arrows 222 and 224.

Figure 8:
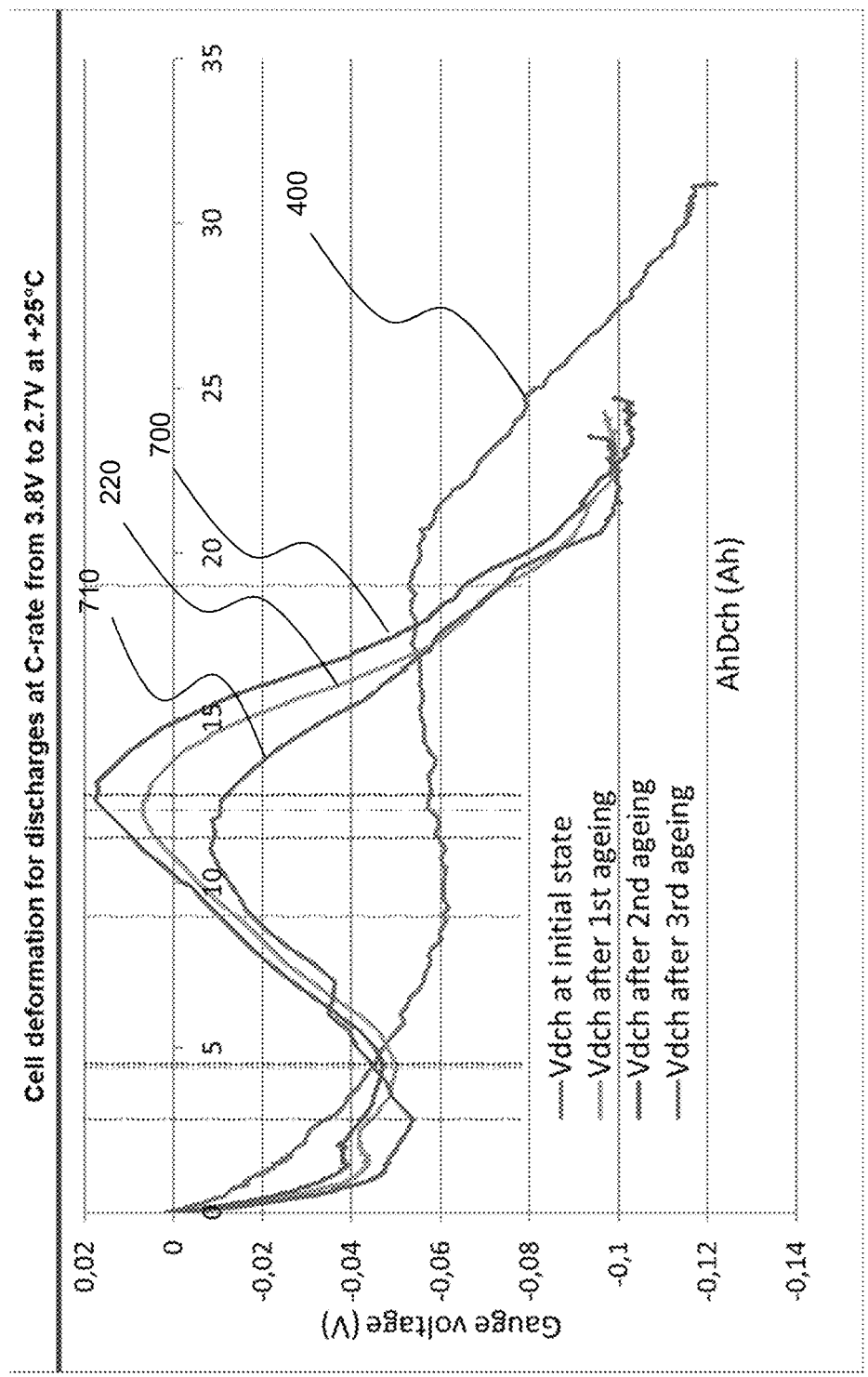
FIG. 8 is an example illustrating the steps in FIG. 3.

FIG. 8 is similar to FIG. 4, except that it comprises two additional curves 700, 710, each representing a deformations image signal obtained for two different aging states of the element. The curve 400 represents the reference image signal. In increasing order of aging of the electrochemical element, the curve 220 represents a first deformations image signal, curve 700 a second, and curve 710 a third deformations image signal. It should be noted that there is generally a shift to the left of the local minimum and local maximum values as the element ages.

FIG. 9 is a table that provides the values $Ah_{PeakMax}[N]$ and $Ah_{PeakMin}[N]$ for each of the curves shown in FIG. 8. The first line corresponds to the curve 400, the second to curve 220, the third to curve 700 and the last line to curve 710. Since the first line corresponds to the initial element, the values of SEI and $C_{neg\_loss}$ are not applicable; the same is true for the last column of the table which represents the loss of capacity.

The examples relating to the estimation of the SOH discussed thus far may be combined with one another.

Figure 5:
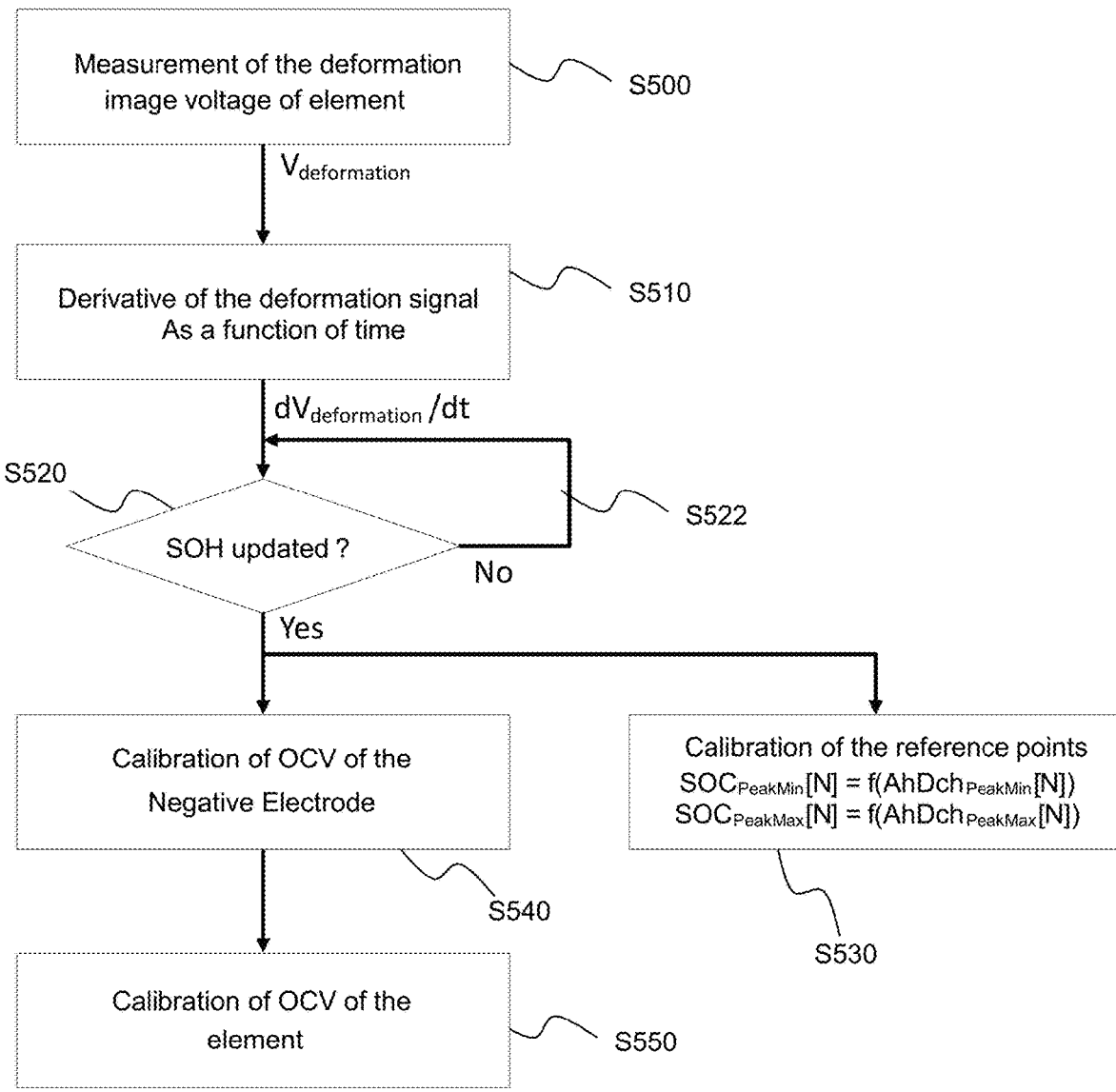
FIG. 5 is an example of an algorithm flowchart for calibration of the tables used for calculating the SOC from the data related to estimation of the SOH.

With reference to FIG. 5, discussed here below are examples of estimation of the SOC of an electrochemical element which uses the SOH estimation method according to the invention. The estimation of the SOH is necessary in order to accurately determine the state of charge of the element since each modification of the real capacity of the element has a direct impact on the estimation of the state of charge. These examples make it possible in particular to estimate the SOC when the electrochemical element has a flat profile (or even flat OCV).

Figure 12:
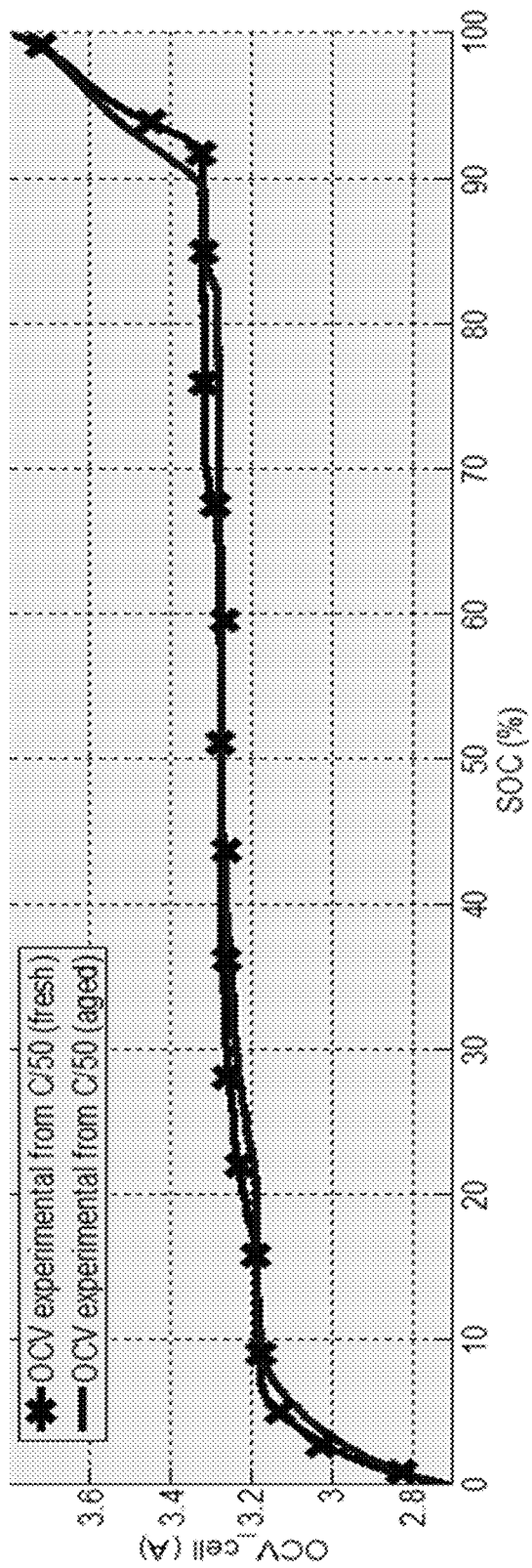
FIG. 12 illustrates an example of recalibration of the OCV table.

FIG. 12 is a screenshot that illustrates the relationship between the OCV and the SOC which is denoted as SOC=f(OCV). This relationship is typically contained in a table that relates an SOC value to a given OCV value. As shown in FIG. 12, this relation may be non-bijective, that is to say that there is not one sole single SOC value for a given OCV value. This is for example the case for SOC values between 40% and 60%. In addition, this relationship varies as a function of the aging of the element, as illustrated in FIG. 12. Again in this instance, there may be not one sole single SOC value for a given OCV value. In addition, it can also be seen that it is the left and right portions of the curves that are the most impacted by these modifications; however these portions correspond respectively to the Zones 1 and 4 discussed with reference to FIG. 1 which moreover are the only ones for which calibration on the voltage measurement is possible.

Referring back to FIG. 5, the steps S500 and S510 are respectively similar to the steps S300 and S310 of FIG. 3, examples of which have previously been discussed. More generally, any of the previously discussed SOH estimation examples may be carried out.

Once the SOH has been obtained, a range of SOC values is determined outside of which a calibration of the open circuit voltage is achievable. In other words, a range of values of the actual SOC in which a calibration of the open circuit voltage is not achievable.

Step S530 is an example of determination of the range of SOC values within which particular points are determined. This range of SOC values is therefore bounded by two particular values: a first value of the range denoted as $SOC_{PeakMin}$ and a second value of the range denoted as $SOC_{PeakMax}$. Each of these two points may be defined as being a reference point or a calibration point on a zone of the element where the calibration of SOC on the OCV is not possible; this is typically the case over a flat zone of a flat profile element.

$SOC_{PeakMin}$ is the value of the SOC for the local minimum of the deformations image signal, the full charge and the full discharge not constituting the local minimum. It should be recalled that $Ah_{PeakMin}[N]$ represents the quantity of electricity that has passed through the electrochemical element when this local minimum of the deformations image signal is reached. Thus, $SOC_{PeakMin}$ is a first value representing the SOC for a null value of the derivative of the reference image signal, or as the case may be, for a minimum value of the deformations image signal.

$SOC_{PeakMax}$ is the SOC value for the local maximum of the deformations image signal, the full charge and the full discharge not constituting the local minimum. It should be recalled that $Ah_{PeakMax}[N]$ represents the quantity of electricity that has passed through the electrochemical element when this local maximum of the deformations image signal is reached. Thus, $SOC_{PeakMax}$ is a second value representing the SOC for a null value of the derivative of the reference image signal, or as the case may be, for a maximum value of the deformations image signal.

$SOC_{PeakMin}$ and $SOC_{PeakMax}$ each represent an actual value of the SOC, that is to say that these two values are a function of $Capa_{batt}[N]$ which is the real capacity of the electrochemical element and not a theoretical capacity.

In examples for which a discharge operation has been initiated, $SOC_{PeakMin}[N]$ is calculated with the following formula:

$$SOC_{PeakMin}[N]=100-100*(Ah_{PeakMin}[N]/Capa_{batt}[N]) \quad (eq.\ 4),$$

and $SOC_{PeakMax}[N]$ is calculated by the following formula:

$$SOC_{PeakMax}[N]=100-100*(Ah_{PeakMax}[N]/Capa_{batt}[N]) \quad (eq.\ 5).$$

In examples for which a charge operation has been initiated, $SOC_{PeakMin}[N]$ is calculated with the formula (eq. 6)

$$SOC_{PeakMin}[N]=100*(Ah_{PeakMin}[N]/Capa_{batt}[N]) \quad (eq.\ 6),$$

and $SOC_{PeakMax}[N]$ is calculated by the formula (eq. 7)

$$SOC_{PeakMax}[N]=100*(Ah_{PeakMax}[N]/Capa_{batt}[N]) \quad (eq.\ 7)$$

In the formulas eq. 4, eq. 5, eq. 6 and eq. 7, $Capa_{batt}[N]$ is an estimate of the capacity of the electrochemical element which is obtained according to the examples discussed for the estimation of SOH. The values $Ah_{PeakMin}[N]$ and $Ah_{PeakMax}[N]$ are defined and obtained as explained with reference to FIG. 3.

Figure 11:
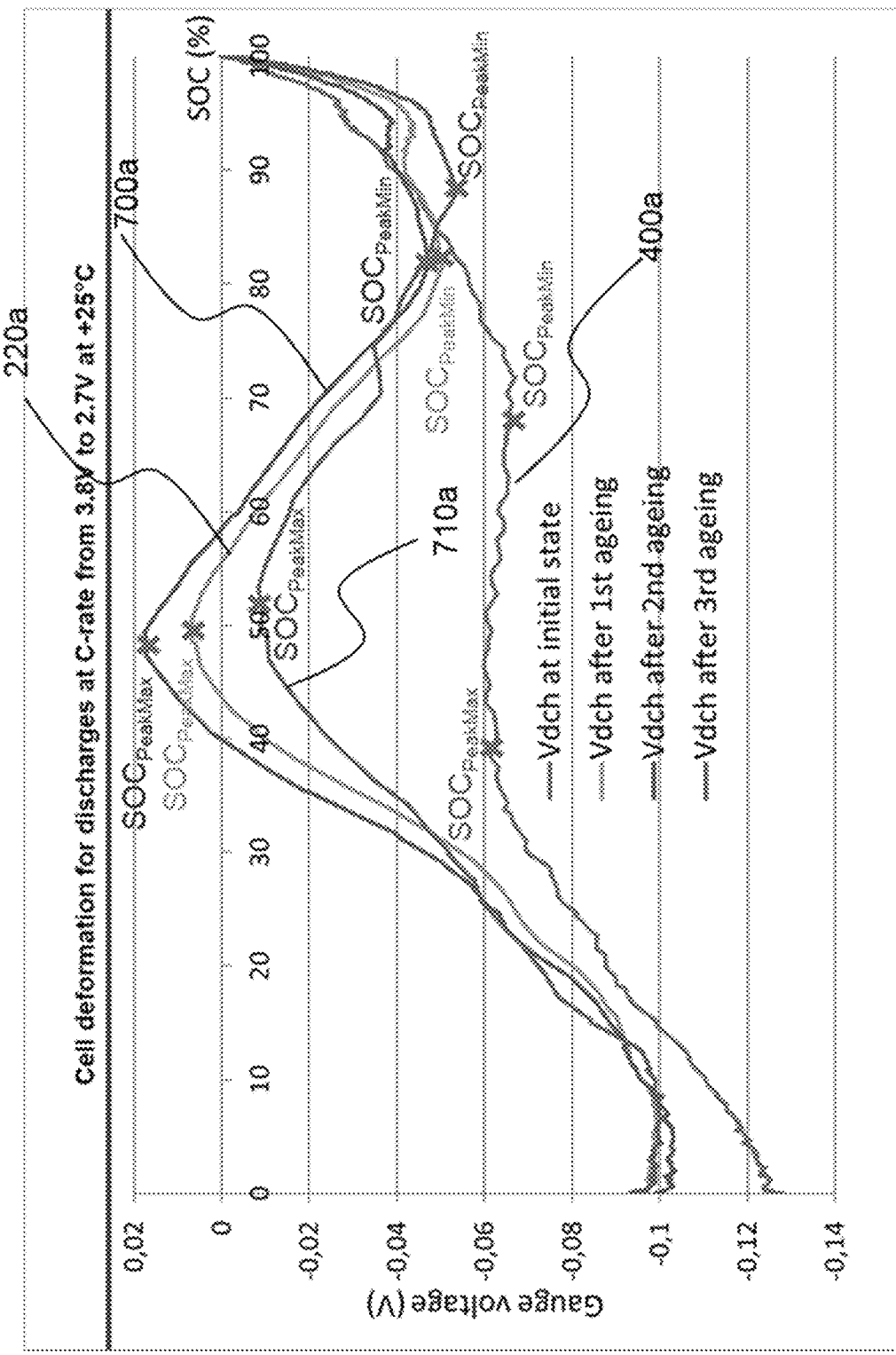
FIG. 11 is an example of a graphical representation of the determination from the deformations image signals of FIG. 8 of the range of SOC values outside of which the open circuit calibration of the element can be effected.

FIG. 11 is an example of representation of the curves of the image signals 400, 220, 700, 710 of FIG. 8 which are now represented as a function of the SOC, respectively 400a, 220a, 700a, 710a. As this is an example of a discharge of the element, the representation of the image signals as a function of SOC is calculated with the following formula:

$$SOC[N]=100-100*(Ah[N]/Capa_{batt}[N]) \quad (eq.\ 8)$$

If a charge operation were carried out, then the representation of the image signals as a function of the SOC would have been calculated with the following formula:

$$SOC[N]=100*(Ah[N]/Capa_{batt}[N]) \quad (eq.\ 9)$$

The formulas eq. 8 and eq. 9 are generalisations, respectively of the formulas eq. 4/5 and eq. 6/7. For any point Ah[N] of the image signal, at least one SOC value (SOC [N]) is associated.

Each of the representations of the image signals of FIG. 11 includes: two calibration points $SOC_{PeakMin}$ and $SOC_{PeakMax}$ which bound a range of current (or even real) SOC values within which a calibration of SOC on the OCV cannot be carried out. It should be recalled that in the examples of FIGS. 8 and 11, the electrochemical element is the same flat profile element. It should be noted that for each of the curves, the range comprised between $SOC_{PeakMin}$ and $SOC_{PeakMax}$ is much narrower as compared to Zone 23 discussed with reference to FIG. 1. Thus, the two points $SOC_{PeakMin}$ and $SOC_{PeakMax}$ make it possible to significantly improve the calculation of the state of charge for an electrochemical element, and in particular for a flat profile electrochemical element, by reducing the zone of uncertainty by allowing calibration over wide ranges of state of charge values. In this example, the zone of uncertainty extends from about 50% to 85% of the SOC, against a zone of uncertainty comprised between about 30% to 90% of the SOC, as discussed with reference to FIG. 1.

FIG. 10 is a table that provides the values $Ah_{PeakMax}[N]$ and $Ah_{PeakMin}[N]$ for each of the curves shown in FIG. 8, and which presents the values of the calibration points $SOC_{PeakMin}$ and $SOC_{PeakMax}$ shown in FIG. 11. It should be noted that the first line corresponds to the curves 400 and 400a, the second to curves 220 and 220a, the third to curves 700 and 700a, and the last line to the curves 710 and 710a. The first line corresponds to the initial element and a value of the reference capacity $Capa_{batt}[N-1]$ is associated with the initial element.

After the calculation of the calibration points $SOC_{PeakMin}$ and $SOC_{PeakMax}$, that is to say after the determination of the range of SOC values bounded by these two points, the calibration of the open circuit voltage of the electrochemical element is carried out. This calibration is performed as a function of the estimate of the aging of the electrochemical element: it uses the SOH of the electrochemical element, and therefore the real capacity $Capa_{batt}[N]$, for the calculation of the calibration points.

In the steps S540 and S550 of FIG. 5, an example of the OCV calibration of the electrochemical element is presented; the calibration is carried out on the negative electrode of the electrochemical element. Indeed, the OCV of the electrochemical element can be defined by the following formula:

$$OCV = OCV_{pos} - OCV_{neg} \qquad \text{(eq. 10)}$$

where $OCV_{pos}$ is the OCV of the positive electrode of the element and $OCV_{neg}$ is the OCV of the negative electrode of the element. A modification linked to the aging of the $OCV_{pos}$ and/or the $OCV_{neg}$ therefore acts on the OCV of the element.

Figure 13:
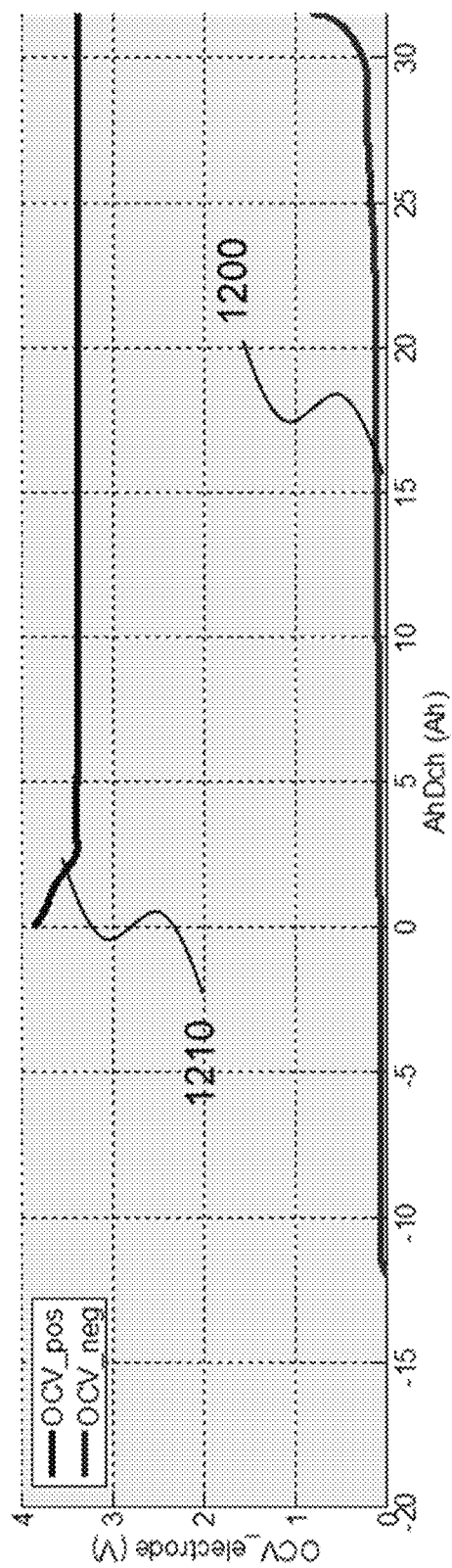
FIG. 13 illustrates an example of recalibration of the OCV table.

FIG. 13 presents two OCV tables, each corresponding to an electrode of the element. The curve 1200 corresponds to the $OCV_{neg}$ of the element, and the curve 1210 to the $OCV_{pos}$ of the element.

Figure 14:
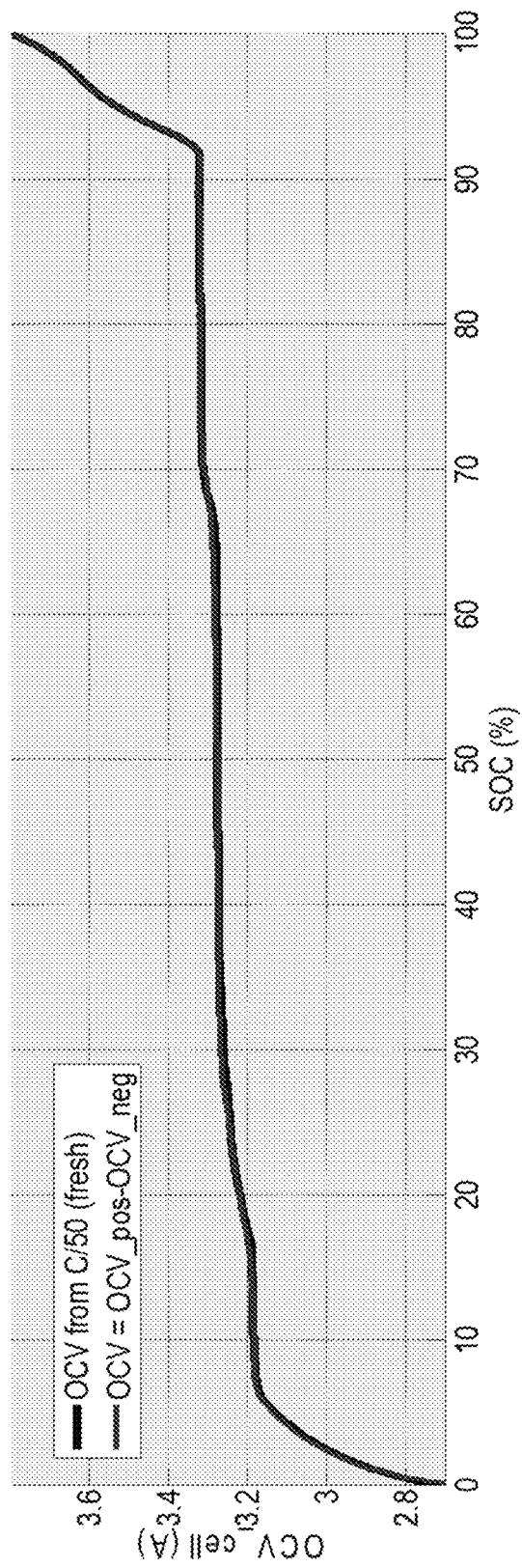
FIG. 14 illustrates an example of recalibration of the OCV table.

FIG. 14 represents the OCV of the element which is the subtraction of the two curves 1200 and 1210 of FIG. 12.

In the step S540, the calibration of the OCV of the negative electrode is carried out.

In examples, the step S540 is implemented as a function of an estimate of the aging of the negative electrode of the electrochemical element (S540).

The estimation of the aging of the negative electrode of the electrochemical element may include the calculation of an estimate of the growth of the passivation layer (SEI) $SEI_{Growth}[N]$ and the calculation of an estimate of a negative capacity loss $C_{neg\_loss}[N]$. The calculation of these two estimates may be performed as explained with reference to the steps S320-S330 and S340 to S350 of FIG. 3.

Figure 15:
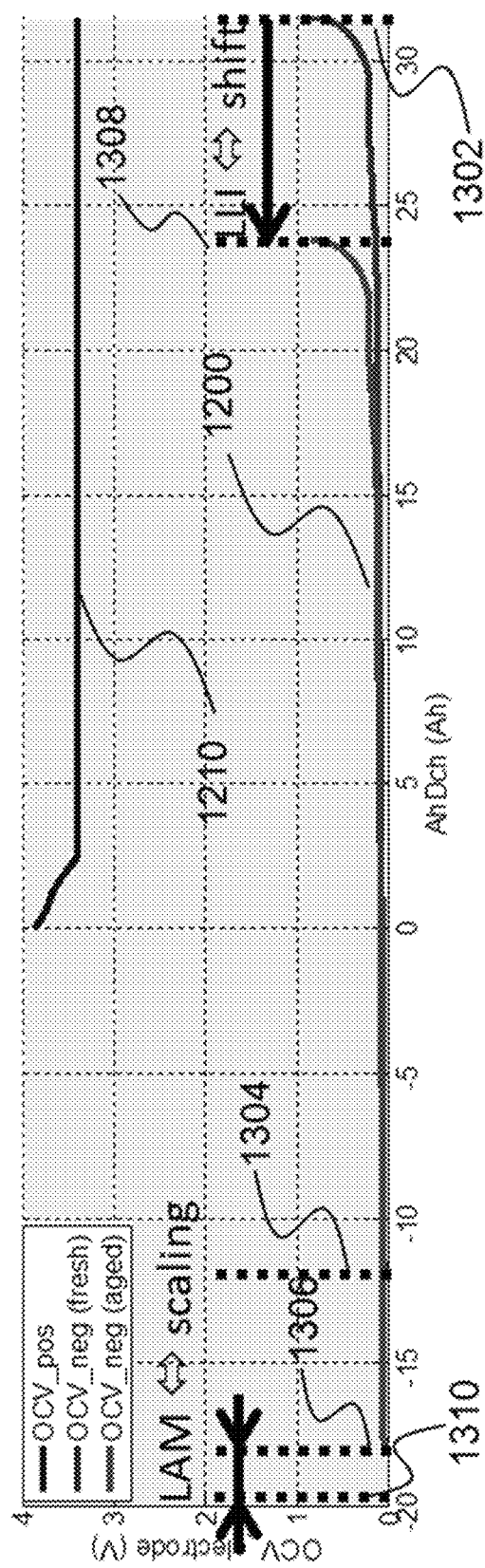
FIG. 15 illustrates an example of recalibration of the OCV table.

In an example where the electrochemical element is of the lithium type, the loss of active lithium (LLI, acronym for Loss of Lithium Inventory) and loss of active material (LAM, acronym for Loss of Active Material) is calculated from the estimates $SEI_{Growth}[N]$ and $C_{neg\_loss}[N]$. The lithium type electrochemical elements are based on a technology where aging is often predominantly by negative capacity loss and growth of SEI. The LLI is mainly linked to the SEI and the LAM is mainly linked to the $C_{neg\_loss}$. The loss of active lithium (LLI) causes a horizontal shift of the potential curves of the electrode and the loss of active material (LAM) causes a compression of the potential curves of the electrodes of the element. This phenomenon is illustrated in FIG. 15 which corresponds to FIG. 13 and on which the same curves 1200, 1210 are shown. Initially, the curve 1200 of the OCV of the negative electrode of the element has values comprised between the points 1302 and 1304. Under the effect of the LLI, the curve 1200 shifts towards the left, with the point 1302 passing into position 1308 and the point 1304 into 1310. At the same time, under the effect of the LAM, the point 1310 is pushed back to position 1306. The curve 1200 is finally shifted to the left and compressed.

The step S540 also includes the correction of the open circuit voltage (OCV) of the negative electrode as a function of the calculation of the loss of active material (LAM) and/or the loss of lithium inventory (LLI). The OCV table of the negative electrode was recalibrated using the results of the analysis of aging based on the measurement of deformation.

Subsequently, in step S550, the OCV of the element is corrected by making use of the formula eq. 10, that is to say, based on the corrected OCV of the negative electrode of the element.

Figure 16:
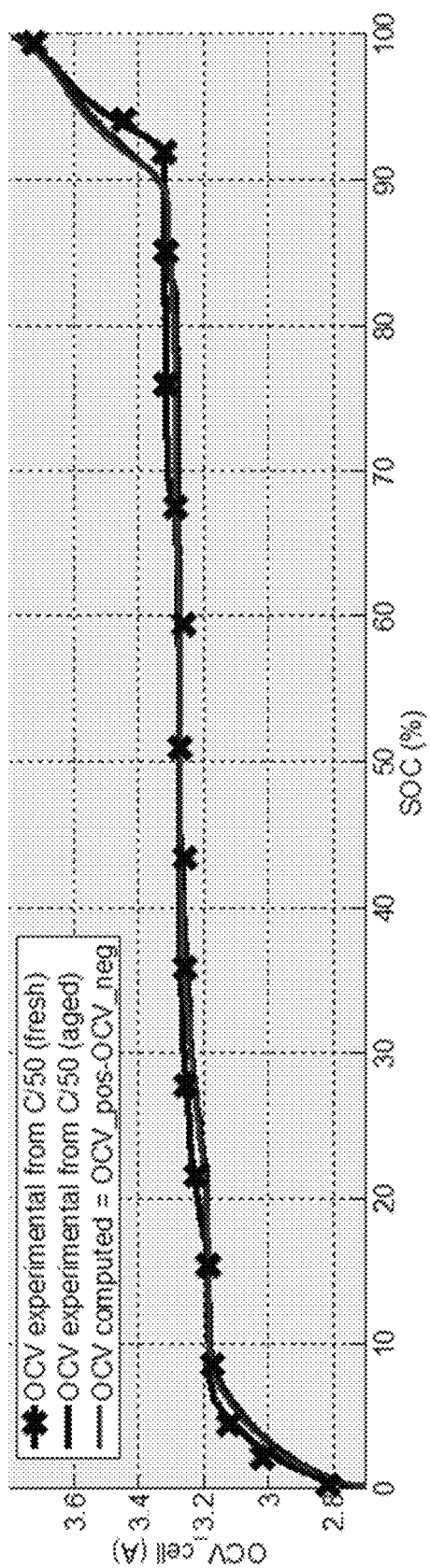
FIG. 16 illustrates an example of recalibration of the OCV table.

FIG. 16 is similar to FIG. 12, except that FIG. 16 includes an additional curve which represents the OCV curve of the electrochemical element which was calculated in step S550. This calculated curve merges with the experimental curve. It will be noted that the calculated OCV is very close to the experimental OCV also in Zones 1 and 4, which considerably improves the precision of the SOC.

Thus, the calculation of SOC for electrochemical elements is improved by enabling precise calculation in Zone 4 and in Zone 1 by recalibrating the OCV based on the aging. In addition, as previously discussed, the zone of uncertainty has been reduced in a manner such that it is possible to recalibrate the SOC over a portion of Zone 23.

Referring back to FIG. 5, the calibration steps S530 to S550 may be executed each time it is determined that the SOH has been updated (S520). When no update has been detected, only the steps S500 and S510 continue to be executed, for example in order to calculate a new SOH.

The SOC determination method according to the invention can be combined with other known methods for determining the SOC. Such a combination is for example advantageous when the electrochemical element is of the flat profile type or indeed even of the phase transition type. It is in fact possible to use a known method for Zones 1 and 4, and the SOC estimation method according to the invention for Zones 2 and 3. Such a known method is discussed for example in the document US2013229154 (A1).

Figure 6:
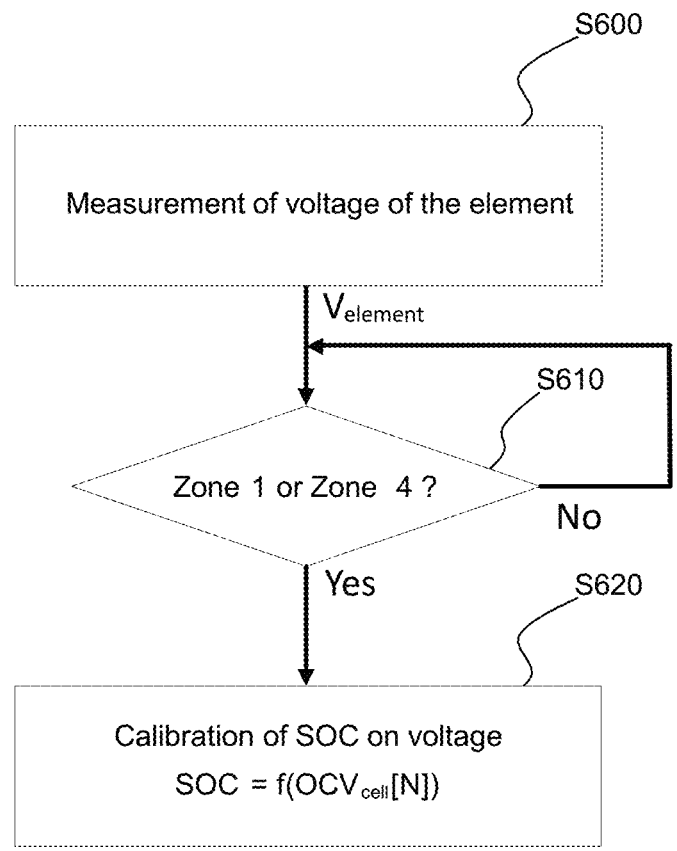
FIG. 6 is an example of an algorithm flowchart the use of which in conjunction with that of FIG. 7 enhances the robustness of the estimation of SOC with frequent recalibrations.

In the example shown in FIG. 6, a voltage measurement (S600) of the element is performed. When it is determined (S610) that the SOC belongs to Zone 1 or 4, a calibration of the SOC on the measured OCV is carried out by using the relation SOC=f(OCV). In examples, such as the example discussed with reference to FIG. 1, the SOC values comprised between 0% and 20% are included in Zone 1, the values comprised between 20% and 90% are included in Zone 23, and the values comprised between 90% and 100% are included in zone 4. It is understood that these ranges may vary depending on the type of element, and may be determined in an arbitrary manner.

Figure 7:
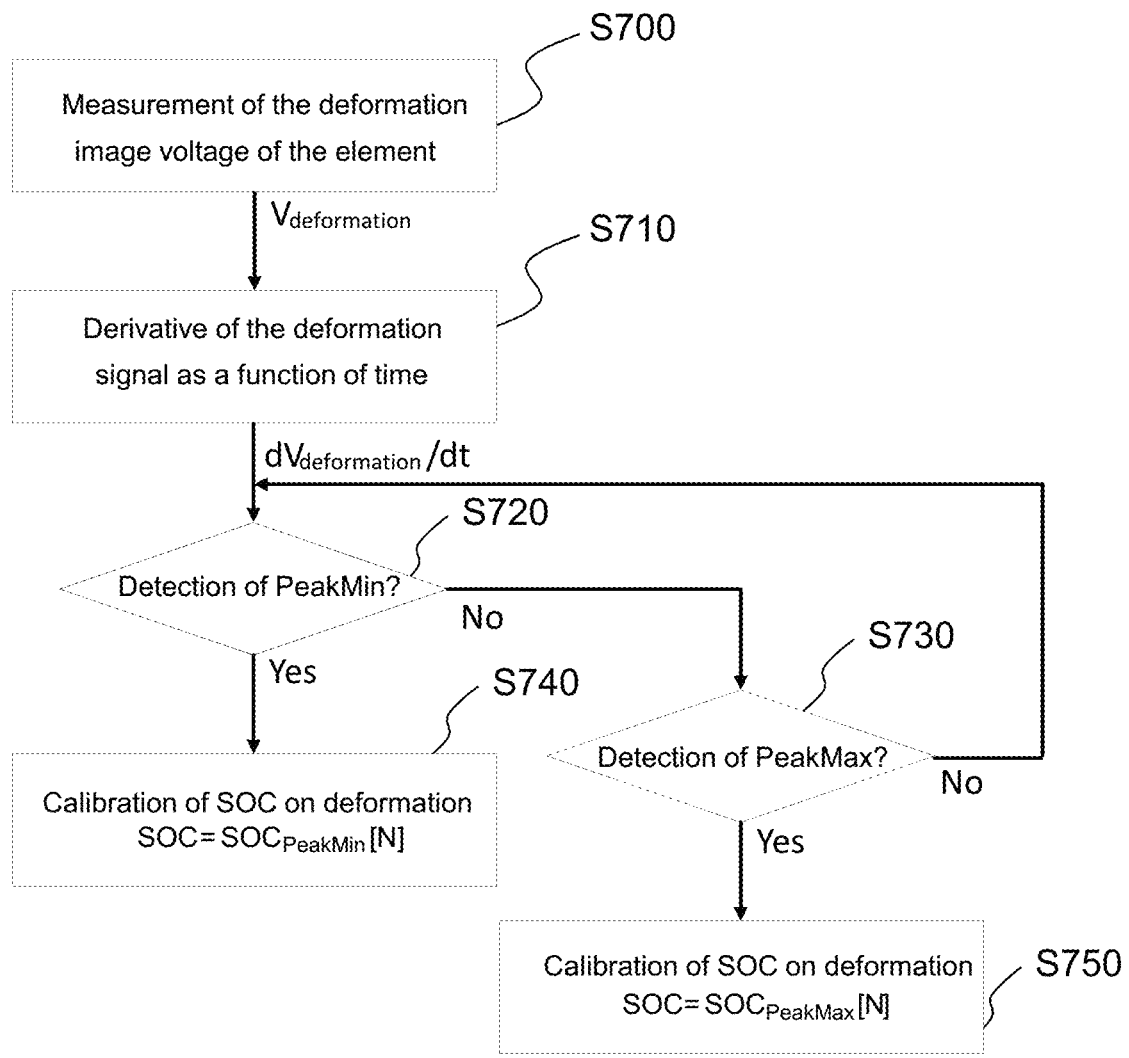
FIG. 7 is an example of an algorithm flowchart the use of which in conjunction with that of FIG. 6 enhances the robustness of the estimation of SOC with frequent recalibrations.

In the example shown in FIG. 7, the steps S700 and S710 produce the derivative of an image signal. These steps are similar respectively to the steps S300 and S310 of FIG. 3. Subsequently, if a value $Ah_{PeakMin}[N]$ is determined (S720), then the SOC is calibrated (S740) for the SOC value corresponding to the local minimum of the deformation image signal. Step S720 is similar to the steps S320, and the step S740 is similar to step S530. If a value $Ah_{PeakMin}[N]$ is not identified (S720), an attempt is made to determine if there exists a value $Ah_{PeakMax}[N]$ in step S730. If this is not the case, a return back to step S720 occurs. If a value $Ah_{PeakMax}[N]$ was identified in step S730, then the SOC is calibrated (S750) for the SOC value corresponding to the local maximum of the deformation image signal. The step S730 is similar to step S340 of FIG. 3, and step S750 is similar to step S530. The two points $Ah_{PeakMin}[N]$ and $Ah_{PeakMax}[N]$ are used to calibrate the SOC on at least a portion of Zone 23.

FIG. 18 shows an example of a system that provides the means for estimating the SOH and/or SOC of an electrochemical element. The system includes a management unit. The management unit comprises a computing unit (CPU) 180 which is connected to a bus 182 to which a memory storage unit 184 is connected. The memory storage unit may be a memory storage unit that can be used to store the instructions and the data necessary for the operation of a computer programme. The memory storage unit may be, but is not limited to, a non-volatile memory storage unit, including for example semiconductor memories such as Erasable Programmable Read-Only Memory (EPROM), Electrically Erasable Programmable Read-Only Memory (EEPROM), flash memory unit, magnetic disks, magneto-optical disks, Compact Disc Read-Only Memory (CD-ROMs), Digital Versatile Disk-Read-Only Memory (DVD-ROM), BlueRay© discs. All of these elements may be supplemented by, or incorporated into, ASICs (acronym for "Application-specific integrated circuits"). The management unit can provide the means for deformation sensors 186 to communicate with the memory storage unit and the computing unit via the BUS 182. These deformation sensors may be arranged on one or more electrochemical elements.

The computer programme may include instructions that are executable by the management unit. The instructions include the means for causing the system to execute the method according to the invention. The programme can be saved and stored on any data storage medium, including the memory storage unit of the management unit. The programme may, for example, be deployed in digital electronic circuits, or in IT equipment, firmware, software applications or combinations thereof. The programme may be deployed in the form of a device, for example a product incorporated in a tangible manner into a machine-readable storage device for execution by a programmable processor. The steps of the method may be executed by a programmable processor executing an instruction programme for executing the functions of the method by operating on input data and generating an output. The processor can thus be programmed and coupled for receiving the data and instructions, for transmitting the data and instructions to a data storage system, to at least one input device, and to at least one output device.

The computer programme may be implemented in a procedural programming language or high-level object-oriented programming language, or in assembler language, or machine language if necessary. In any case, the language may be a compiled or interpreted language. The programme may be a full installer or an update programme. The application of the programme on the system leads in any case to instructions for the execution of the method.

The programme and the system can only provide an estimate of the SOH, or else even only provide an estimate of the SOC, or provide an estimate of the SOH and the SOC. It is understood that when an estimation of the SOC is performed, the programme performs an estimation of the SOH in advance.

The memory storage unit of the system shown in FIG. 18 stores the computer programme which includes the programme code instructions for execution of the method for estimating the SOH and/or the SOC according to the invention. The memory storage unit is also able to store at least the values of the reference image signal. These values are typically $Ah_{PeakMin}[N-1]$ and $Ah_{PeakMax}[N-1]$, and the quantity of electricity that passed through the electrochemical element when the reference image signal was established. These values may in addition also include $SOC_{PeakMin}[N-1]$ and $SOC_{PeakMax}[N-1]$. The memory storage unit can additionally also store the values of the calculated image signal, and the values of the comparison. The memory storage unit can additionally also store a reference image signal and/or the derivative of this reference image signal. The memory storage unit can also store one or more reference capacity values $Capa_{batt}[N-1]$.

In examples, the deformation sensor is a strain gauge which outputs a deformation image voltage over time or in real time. The deformation image signal is formed as a function of the quantity of electricity passing through the electrochemical element over time because the quantity of electricity that passes through the electrochemical element is measured in real time. The link between the deformation image voltage in real time and the quantity of electricity passing through the electrochemical element over time is immediate. More generally, the measurements of the deformations of the electrochemical element may be performed with any sensor that is capable of detecting and producing a value representing a deformation.

In examples shown in FIGS. 2, 4, 8 to 11, the electrochemical element has a cylindrical shaped form (for example a cylindrical battery) and the sensor used is a strain gauge which is arranged on the surface of the element along a direction that is substantially perpendicular to the axis of the cylinder; the gauge is therefore arranged in a manner such that it is able to measure a deformation of the diameter of the cylinder. Still in these examples, the strain gauge is also arranged substantially in the middle of the cylinder—that is to say that the distance separating the sensor from each of the two ends of the cylinder is substantially the same. Such a positional arrangement of the sensor in relation to a cylindrical element makes it possible to measure the deformations in a zone where the deformations are the greatest; this makes it possible for example to use a less sensitive sensor or one with a larger measurement error. It will be understood that the positional arrangement of the sensor is not limited to this example. In a general manner, all configurations may be envisaged if a deformation of the element can be measured. The different positional arrangements may depend, for example, on the shape or form of the electrochemical element, on the type of sensor (sensitivity, measurement error, measurement that may be performed along one, or two or more directions, etc.).

In one example, an assembly includes the SOH-SOC estimation system for estimating the SOH and/or the SOC of an electrochemical element and an electrochemical element. The electrochemical element includes a sensor which will measure the values of deformations over the element. The assembly may include a battery made up of one or more electrochemical elements. A battery comprises a plurality of elements capable of being grouped together within the same enclosure. A battery can be divided into modules, each module being composed of a plurality of elements that are connected to each other in series and/or in parallel. The battery is intended to supply electrical energy for an exterior application. A charge circuit is generally provided to which the battery can be connected in order to recharge the elements. A management system comprising measurement sensors and an electronic control circuit, that is more or less advanced depending on the applications, may be associated with the battery.

Figure 17:
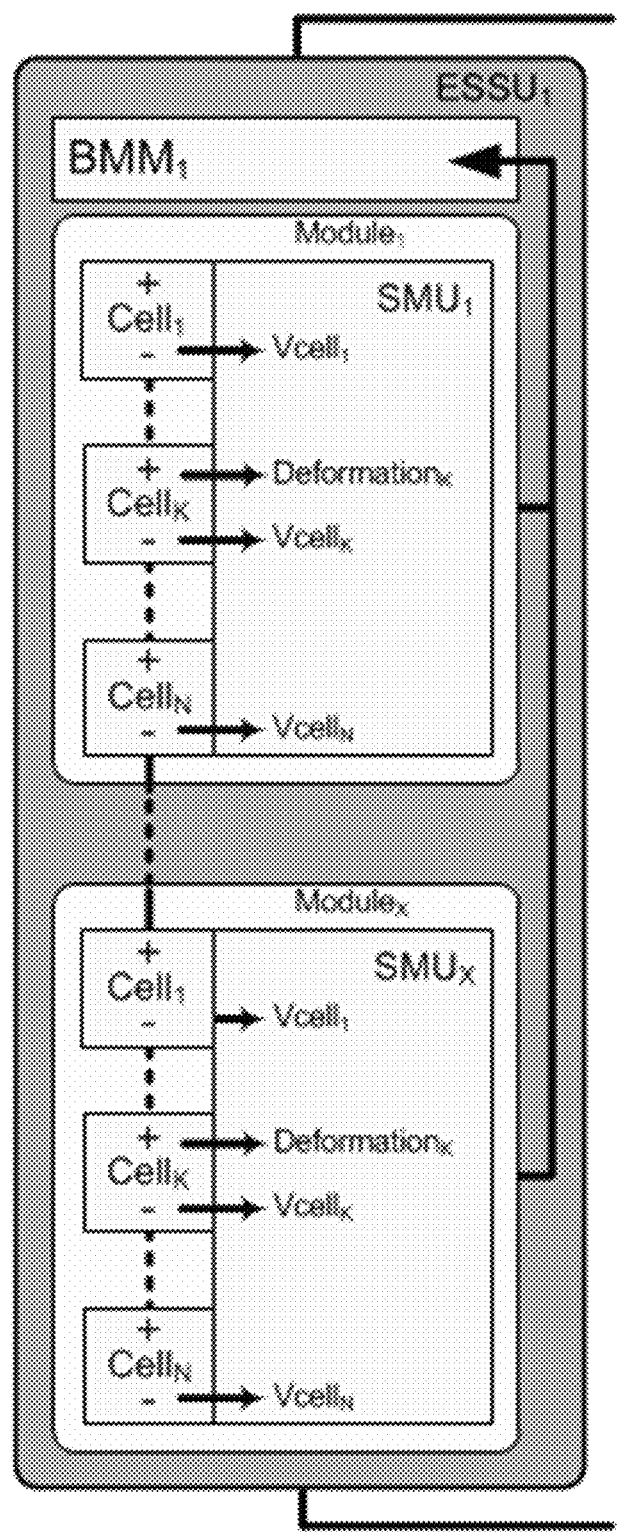
FIG. 17 is an example of a battery.

FIG. 17 is an example of configuration of a battery in which N electrochemical elements (Cell1, Cell2, . . . , CellN) are connected in series and disposed together in the same enclosure in order to form a first module (Module 1). In a similar manner, N electrochemical elements are connected in series and disposed in an x-th enclosure in order to form an x-th module (Modulex). The X modules are connected in series in order to form a battery (Bat). The X modules constitute a branch of the circuit. The elements are also not necessarily connected in series but may also be connected in parallel. It is also possible to envisage connecting certain elements to each other in parallel in order to obtain several combinations of elements in parallel and then to connect these combinations of elements in series. Likewise, the battery may comprise any number of modules, in a configuration not necessarily limited to a connection in series. For example, the battery may include p parallel branches, each parallel branch comprising at least one element or at least one module.

Each element may be provided with a measurement means for measuring the voltage at its terminals. Preferably, an element is also provided with a means making it possible to measure its operating temperature. This measurement means is placed on a judiciously chosen point of the element in order to obtain a representation of its average and/or maximum and/or minimum temperature. If the battery includes a plurality of elements, each element may be provided with a temperature sensor, which however renders the electronic circuits more complex.

The battery must include at least one deformation sensor. The one or more deformation sensor(s) may be disposed on the elements, or indeed on the modules. In practice, one single element of the battery comprises a gauge because a battery in principle comprises identical elements which age and change in a similar manner.

The SOH and/or SOC evaluation method according to the invention is applicable to any type of electrochemical element. The method is particularly suitable for electrochemical elements of the type that has a no-load voltage (OCV) curve as a function of the state of charge (SOC) which comprises a flat zone, the relationship between the state of charge and the open circuit voltage (OCV) may be non-bijective. Such elements for example, are known from the documents EP-A-2 144 075, EP-A-2 239 826 and EP-A-2 309 615 in which by way of the positive electrode material of an element use is made of the lithiated phosphates of at least one transition metal, in particular compounds of the type such as $LiMPO_4$ where M, is selected from the group comprising Fe, Co, Ni, Mn and a mixture thereof.

In addition, the method according to the invention can be applied to any type of electrochemical element, regardless of its format. By way of non-limiting examples, the electrochemical element may be in the following forms: cylindrical, prismatic, button, pouch. In one example, a "pouch" type electrochemical element includes at least one cell that may comprise a metal plate which integrates a positive electrode, a negative electrode, and a separator. Such a cell results from the assembling by juxtaposition of an assembly of components that are in the form of flexible sheets joined together in a casing envelope, and thus forming a "pouch" type element.

The invention claimed is:

1. A method for estimating the state of health (SOH) of an electrochemical element, comprising:
    an initiation of a charge or discharge operation of the electrochemical element;
    a measurement of values representing deformations of the electrochemical element while the charge or discharge operation is being performed, the measured deformation values forming a deformations image signal as a function of the quantity of electricity passing through the electrochemical element over time; and
    a comparison between the deformations image signal and a reference image signal, one or more differences obtained by the comparison characterizing an estimation of aging of the electrochemical element, wherein the one or more differences obtained by the comparison characterize an estimation of a growth of a passivation layer (SEI) $SEI_{Growth}[N]$ and an estimation of a negative capacity loss $C_{neg\_loss}[N]$,
    wherein the comparison further comprises:
    a calculation of an estimate of the real capacity of the electrochemical element $Capa_{batt}[N]$ by making use of the formula:

$$Capa_{Batt}[N]=Capa_{Batt}[N-1]-(Sei_{Growth}[N]+C_{Neg\_Loss}[N])$$

where
$Capa_{batt}[N-1]$ is a reference capacity value.

2. The method according to claim 1, wherein the estimate of the growth of a passivation layer (SEI) $SEI_{Growth}[N]$ is calculated by the formula:

$$SEI_{Growth}[N]=Ah_{PeakMin}[N-1]-Ah_{PeakMin}[N]$$

where
$Ah_{PeakMin}[N-1]$ is a first value representing a quantity of electricity that has passed through the electrochemical element for a minimum value of the reference image signal;
$Ah_{PeakMin}[N]$ is a second value representing a quantity of electricity that has passed through the electrochemical element for a minimum value of the deformations image signal;
and wherein the estimate of the negative capacity loss $C_{neg\_loss}[N]$ is calculated by the formula:

$$C_{neg\_loss}[N]=(Ah_{PeakMax}[N-1]-Ah_{PeakMin}[N-1])-(Ah_{PeakMax}[N]-Ah_{PeakMin}[N])$$

where
$Ah_{PeakMin}[N-1]$ is the first value representing a quantity of electricity that has passed through the electrochemical element for the minimum value of the reference image signal;

$Ah_{PeakMin}[N]$ is the second value representing quantity of electricity that has passed through the electrochemical element for the minimum value of the reference image signal;

$Ah_{PeakMax}[N-1]$ is a third value representing a quantity of electricity that has passed through the electrochemical element for a maximum value of the reference image signal;

$Ah_{PeakMax}[N]$ is a fourth value representing a quantity of electricity that has passed through the electrochemical element for a maximum value of the deformations image signal.

3. The method according to claim 1, wherein the reference image signal is obtained according to the same steps as the image signal calculated during a preceding charge or discharge operation.

4. The method according to claim 3, wherein the preceding charge or discharge operation is the first charge or discharge operation of the electrochemical element.

5. The method according to claim 1, further comprising:
a calculation of the time derivative of the reference image signal;
and wherein the comparison comprises:
the comparison between the calculated derivative and a reference derivative.

6. A method for estimating the state of charge (SOC) of an electrochemical element, comprising:
an initiation of a charge or discharge operation of the electrochemical element;
a measurement of values representing deformations of the electrochemical element while the charge or discharge operation is being performed, the measured deformation values forming a deformations image signal as a function of the quantity of electricity passing through the electrochemical element over time;
a comparison between the deformations image signal and a reference image signal, one or more differences obtained by the comparison characterizing an estimation of aging of the electrochemical element;
a determination of a range of state of charge values (SOC) bounded by a first value $SOC_{PeakMin}$ that represents the current SOC of the element for a minimum value of the deformations image signal, and a second value $SOC_{PeakMax}$ that represents the current SOC of the element for a maximum value of the deformations image signal; and
outside of the said range a calibration of the open circuit voltage (OCV) of the electrochemical element.

7. The method according to claim 6, wherein the calibration further comprises the estimation of the aging of the electrochemical element by an estimation of a growth of a passivation layer (SEI) $SEI_{Growth}[N]$ and an estimation of a negative capacity loss $C_{neg\_loss}[N]$, and wherein the calibration of the open circuit voltage (OCV) of the electrochemical element comprises the calibration of the open circuit voltage (OCV) of the negative electrode of the electrochemical element by performing:
the calculation of a loss of active material (LAM) and/or a loss of lithium inventory (LLI) corresponding to the estimation of the growth of the passivation layer (SEI) $SEI_{Growth}[N]$ and of the estimation of the negative capacity loss $C_{neg\_loss}[N]$;
the correction of the open circuit voltage (OCV) of the negative electrode as a function of the calculation of the loss of active material (LAM) and/or the loss of lithium inventory (LLI).

8. The method according to claim 6, wherein the determination of a range of values comprises for a discharge operation of an electrochemical element:
the calculation of the value $SOC_{PeakMin}[N]$ by the formula:

$$SOC_{PeakMin}[N]=100-100*(Ah_{PeakMin}[N]/Capa_{batt}[N])$$

the calculation of the value $SOC_{PeakMax}[N]$ by the formula:

$$SOC_{PeakMax}[N]=100-100*(Ah_{PeakMax}[N]/Capa_{batt}[N])$$

and wherein the determination of a range of values comprises for a charging operation of the electrochemical element:
the calculation of the minimum value of the range $SOC_{PeakMin}[N]$ by the formula:

$$SOC_{PeakMin}[N]=100*(Ah_{PeakMin}[N]/Capa_{batt}[N])$$

the calculation of the maximum value of the range $SOC_{PeakMax}[N]$ by the formula:

$$SOC_{PeakMax}[N]=100*(Ah_{PeakMax}[N]/Capa_{batt}[N]),$$

where
$Ah_{PeakMin}[N]$ is the second value representing a quantity of electricity that has passed through the electrochemical element for the minimum value of the reference image signal;
$Ah_{PeakMax}[N]$ is a fourth value representing a quantity of electricity that has passed through the electrochemical element for a maximum value of the deformations image signal; and
$Capa_{batt}[N]$ is an estimate of the actual capacity of the electrochemical element.

9. The method according to claim 8, wherein the estimation of the aging of the electrochemical element comprises an estimation of a growth of a passivation layer (SEI) $SEI_{Growth}[N]$ and an estimation of a negative capacity loss $C_{neg\_loss}[N]$,
and wherein the comparison further comprises:
the calculation of an estimate of the actual capacity of the electrochemical element $Capa_{batt}[N]$ by making use of the formula:

$$Capa_{batt}[N]=Capa_{batt}[N-1]-(SEI_{Growth}[N]+C_{neg\_loss}[N])$$

where
$Capa_{batt}[N-1]$ is a reference capacity value;
$SEI_{Growth}[N]$ is the estimate of the growth of the passivation layer (SEI);
$C_{neg\_joss}[N]$ is the estimate of negative capacity loss.

10. An assembly comprising:
a system comprising:
a deformation sensor for detecting deformations of the electrochemical element;
a management unit for managing the electrochemical element, the management unit being in communication with the sensor and comprising a computing unit coupled to a memory storage unit, with the memory storage unit storing program code instructions for the execution by the computer unit of a method for estimating the state of charge (SOC) of an electrochemical element, the method comprising:
an initiation of a charge or discharge operation of the electrochemical element;
a measurement of values representing deformations of the electrochemical element while the charge or discharge operation is being performed, the measured deformation values forming a deformations image signal as a function of the quantity of electricity passing through the electrochemical element over time;

a comparison between the deformations image signal and a reference image signal, one or more differences obtained by the comparison characterizing an estimation of aging of the electrochemical element; and a determination of a range of state of charge values (SOC) bounded by a first value $SOC_{PeakMin}$ that represents the current SOC of the element for a minimum value of the deformations image signal, and a second value $SOC_{PeakMax}$ that represents the current SOC of the element for a maximum value of the deformations image signal; and outside of the said range, a calibration of the open circuit voltage (OCV) of the electrochemical element; and a battery comprising at least one electrochemical element coupled with the deformation sensor.

11. The assembly according to claim 10, wherein the electrochemical element is of the type that has a state of charge curve comprising a flat zone wherein the relationship between the state of charge and/or the open circuit voltage (OCV) is non-bijective.

12. The assembly according to claim 10, wherein the deformation sensor of the system is a strain gauge, which delivers a voltage that forms the deformations image signal as a function of the quantity of electricity passing through the electrochemical element over time.

* * * * *